(12) United States Patent
Schultz

(10) Patent No.: US 9,953,112 B2
(45) Date of Patent: Apr. 24, 2018

(54) METHOD AND SYSTEM FOR DISPLAYING ROOM INTERIORS ON A FLOOR PLAN

(71) Applicant: Pictometry International Corp., Rochester, NY (US)

(72) Inventor: Stephen L. Schultz, West Henrietta, NY (US)

(73) Assignee: Pictometry International Corp., Rochester, NY (US)

( * ) Notice: Subject to any disclaimer, the term of this patent is extended or adjusted under 35 U.S.C. 154(b) by 401 days.

(21) Appl. No.: 14/617,575

(22) Filed: Feb. 9, 2015

(65) Prior Publication Data

US 2015/0227644 A1   Aug. 13, 2015

Related U.S. Application Data

(60) Provisional application No. 61/937,488, filed on Feb. 8, 2014.

(51) Int. Cl.
| | |
|---|---|
| *G06F 7/48* | (2006.01) |
| *G06F 17/50* | (2006.01) |
| *G06T 19/00* | (2011.01) |
| *H04W 4/02* | (2018.01) |
| *G01C 15/00* | (2006.01) |

(52) U.S. Cl.
CPC ....... *G06F 17/5004* (2013.01); *G01C 15/002* (2013.01); *G06T 19/00* (2013.01); *H04W 4/023* (2013.01)

(58) Field of Classification Search
CPC ....... G06T 19/00; G01C 15/002; G01C 11/02; G06F 17/5004; H04W 4/023; G06Q 10/10; G01S 5/02
See application file for complete search history.

(56) References Cited

U.S. PATENT DOCUMENTS

| | | |
|---|---|---|
| 2,273,876 A | 2/1942 | Lutz et al. |
| 3,153,784 A | 10/1964 | Petrides et al. |
| 3,594,556 A | 7/1971 | Edwards |
| 3,614,410 A | 10/1971 | Bailey |
| 3,621,326 A | 11/1971 | Hobrough |
| 3,661,061 A | 5/1972 | Tokarz |
| 3,716,669 A | 2/1973 | Watanabe et al. |
| 3,725,563 A | 4/1973 | Woycechowsky |
| 3,864,513 A | 2/1975 | Halajian et al. |
| 3,866,602 A | 2/1975 | Furihata |
| 3,877,799 A | 4/1975 | O'Donnell |

(Continued)

FOREIGN PATENT DOCUMENTS

| | | |
|---|---|---|
| AT | 331204 T | 7/2006 |
| BR | 0316110 | 9/2005 |

(Continued)

OTHER PUBLICATIONS

Ackermann, Prospects of Kinematic GPS Aerial Triangulation, ITC Journal, 1992.

(Continued)

*Primary Examiner* — Kandasamy Thangavelu
(74) *Attorney, Agent, or Firm* — Dunlap Codding, P.C.

(57) ABSTRACT

A system and method for generating multi-3D perspective floor plans having real-life physical characteristics. The multi-3D perspective floor plans may be generated using image data and related to a floor plan of a structure.

19 Claims, 9 Drawing Sheets

(56) References Cited

U.S. PATENT DOCUMENTS

| | | |
|---|---|---|
| 4,015,080 A | 3/1977 | Moore-Searson |
| 4,044,879 A | 8/1977 | Stahl |
| 4,184,711 A | 1/1980 | Wakimoto |
| 4,240,108 A | 12/1980 | Levy |
| 4,281,354 A | 7/1981 | Conte |
| 4,344,683 A | 8/1982 | Stemme |
| 4,360,876 A | 11/1982 | Girault et al. |
| 4,382,678 A | 5/1983 | Thompson et al. |
| 4,387,056 A | 6/1983 | Stowe |
| 4,396,942 A | 8/1983 | Gates |
| 4,463,380 A | 7/1984 | Hooks |
| 4,489,322 A | 12/1984 | Zulch et al. |
| 4,490,742 A | 12/1984 | Wurtzinger |
| 4,491,399 A | 1/1985 | Bell |
| 4,495,500 A | 1/1985 | Vickers |
| 4,527,055 A | 7/1985 | Harkless et al. |
| 4,543,603 A | 9/1985 | Laures |
| 4,586,138 A | 4/1986 | Mullenhoff et al. |
| 4,635,136 A | 1/1987 | Ciampa et al. |
| 4,653,136 A | 3/1987 | Denison |
| 4,653,316 A | 3/1987 | Fukuhara |
| 4,673,988 A | 6/1987 | Jansson et al. |
| 4,686,474 A | 8/1987 | Olsen et al. |
| 4,688,092 A | 8/1987 | Kamel et al. |
| 4,689,748 A | 8/1987 | Hofmann |
| 4,707,698 A | 11/1987 | Constant et al. |
| 4,758,850 A | 7/1988 | Archdale et al. |
| 4,805,033 A | 2/1989 | Nishikawa |
| 4,807,024 A | 2/1989 | Mclaurin et al. |
| 4,814,711 A | 3/1989 | Olsen et al. |
| 4,814,896 A | 3/1989 | Heitzman et al. |
| 4,843,463 A | 6/1989 | Michetti |
| 4,899,296 A | 2/1990 | Khattak |
| 4,906,198 A | 3/1990 | Cosimano et al. |
| 4,953,227 A | 8/1990 | Katsuma et al. |
| 4,956,872 A | 9/1990 | Kimura |
| 5,034,812 A | 7/1991 | Rawlings |
| 5,086,314 A | 2/1992 | Aoki et al. |
| 5,121,222 A | 6/1992 | Endoh et al. |
| 5,138,444 A | 8/1992 | Hiramatsu |
| 5,155,597 A | 10/1992 | Lareau et al. |
| 5,164,825 A | 11/1992 | Kobayashi et al. |
| 5,166,789 A | 11/1992 | Myrick |
| 5,191,174 A | 3/1993 | Chang et al. |
| 5,200,793 A | 4/1993 | Ulich et al. |
| 5,210,586 A | 5/1993 | Grage et al. |
| 5,231,435 A | 7/1993 | Blakely |
| 5,247,356 A | 9/1993 | Ciampa |
| 5,251,037 A | 10/1993 | Busenberg |
| 5,265,173 A | 11/1993 | Griffin et al. |
| 5,267,042 A | 11/1993 | Tsuchiya et al. |
| 5,270,756 A | 12/1993 | Busenberg |
| 5,296,884 A | 3/1994 | Honda et al. |
| 5,335,072 A | 8/1994 | Tanaka et al. |
| 5,342,999 A | 8/1994 | Frei et al. |
| 5,345,086 A | 9/1994 | Bertram |
| 5,353,055 A | 10/1994 | Hiramatsu |
| 5,369,443 A | 11/1994 | Woodham |
| 5,402,170 A | 3/1995 | Parulski et al. |
| 5,414,462 A | 5/1995 | Veatch |
| 5,467,271 A | 11/1995 | Abel et al. |
| 5,481,479 A | 1/1996 | Wight et al. |
| 5,486,948 A | 1/1996 | Imai et al. |
| 5,506,644 A | 4/1996 | Suzuki et al. |
| 5,508,736 A | 4/1996 | Cooper |
| 5,555,018 A | 9/1996 | von Braun |
| 5,604,534 A | 2/1997 | Hedges et al. |
| 5,617,224 A | 4/1997 | Ichikawa et al. |
| 5,633,946 A | 5/1997 | Lachinski et al. |
| 5,668,593 A | 9/1997 | Lareau et al. |
| 5,677,515 A | 10/1997 | Selk et al. |
| 5,798,786 A | 8/1998 | Lareau et al. |
| 5,835,133 A | 11/1998 | Moreton et al. |
| 5,841,574 A | 11/1998 | Willey |
| 5,844,602 A | 12/1998 | Lareau et al. |
| 5,850,352 A | 12/1998 | Moezzi et al. |
| 5,852,753 A | 12/1998 | Lo et al. |
| 5,894,323 A | 4/1999 | Kain et al. |
| 5,899,945 A | 5/1999 | Baylocq et al. |
| 5,963,664 A | 10/1999 | Kumar et al. |
| 6,037,945 A | 3/2000 | Loveland |
| 6,088,055 A | 7/2000 | Lareau et al. |
| 6,094,215 A | 7/2000 | Sundahl et al. |
| 6,097,854 A | 8/2000 | Szeliski et al. |
| 6,108,032 A | 8/2000 | Hoagland |
| 6,130,705 A | 10/2000 | Lareau et al. |
| 6,157,747 A | 12/2000 | Szeliski et al. |
| 6,167,300 A | 12/2000 | Cherepenin et al. |
| 6,201,546 B1 | 3/2001 | Bodor et al. |
| 6,222,583 B1 | 4/2001 | Matsumura et al. |
| 6,236,886 B1 | 5/2001 | Cherepenin et al. |
| 6,256,057 B1 | 7/2001 | Mathews et al. |
| 6,373,522 B2 | 4/2002 | Mathews et al. |
| 6,421,610 B1 | 7/2002 | Carroll et al. |
| 6,434,280 B1 | 8/2002 | Peleg et al. |
| 6,597,818 B2 | 7/2003 | Kumar et al. |
| 6,639,596 B1 | 10/2003 | Shum et al. |
| 6,711,475 B2 | 3/2004 | Murphy |
| 6,731,329 B1 | 5/2004 | Feist et al. |
| 6,747,686 B1 | 6/2004 | Bennett |
| 6,810,383 B1 | 10/2004 | Loveland |
| 6,816,819 B1 | 11/2004 | Loveland |
| 6,826,539 B2 | 11/2004 | Loveland |
| 6,829,584 B2 | 12/2004 | Loveland |
| 6,834,128 B1 | 12/2004 | Altunbasak et al. |
| 6,876,763 B2 | 4/2005 | Sorek et al. |
| 7,009,638 B2 | 3/2006 | Gruber et al. |
| 7,018,050 B2 | 3/2006 | Ulichney et al. |
| 7,046,401 B2 | 5/2006 | Dufaux et al. |
| 7,061,650 B2 | 6/2006 | Walmsley et al. |
| 7,065,260 B2 | 6/2006 | Zhang et al. |
| 7,123,382 B2 | 10/2006 | Walmsley et al. |
| 7,127,348 B2 | 10/2006 | Smitherman et al. |
| 7,133,551 B2 | 11/2006 | Chen |
| 7,142,984 B2 | 11/2006 | Rahmes et al. |
| 7,184,072 B1 | 2/2007 | Loewen et al. |
| 7,199,793 B2 | 4/2007 | Oh et al. |
| 7,233,691 B2 | 6/2007 | Setterholm |
| 7,262,790 B2 | 8/2007 | Bakewell |
| 7,277,572 B2 | 10/2007 | MacInnes et al. |
| 7,348,895 B2 | 3/2008 | Lagassey |
| 7,509,241 B2 | 3/2009 | Guo |
| 7,728,833 B2 | 6/2010 | Verma |
| 7,832,267 B2 | 11/2010 | Woro |
| 7,844,499 B2 | 11/2010 | Yahiro |
| 8,078,396 B2 | 12/2011 | Meadow |
| 8,705,843 B2 | 4/2014 | Lieckfeldt |
| 9,398,413 B1 * | 7/2016 | Scalise ................. H04W 4/023 |
| 2002/0041328 A1 | 4/2002 | LeCompte et al. |
| 2002/0041717 A1 | 4/2002 | Murata et al. |
| 2002/0114536 A1 | 8/2002 | Xiong et al. |
| 2003/0014224 A1 | 1/2003 | Guo et al. |
| 2003/0043824 A1 | 3/2003 | Remboski et al. |
| 2003/0088362 A1 | 5/2003 | Melero et al. |
| 2003/0164962 A1 | 9/2003 | Nims et al. |
| 2003/0214585 A1 | 11/2003 | Bakewell |
| 2004/0105090 A1 | 6/2004 | Schultz et al. |
| 2004/0122628 A1 | 6/2004 | Laurie |
| 2004/0167709 A1 | 8/2004 | Smitherman et al. |
| 2005/0073241 A1 | 4/2005 | Yamauchi et al. |
| 2005/0088251 A1 | 4/2005 | Matsumoto |
| 2005/0169521 A1 | 8/2005 | Hel-Or |
| 2006/0028550 A1 | 2/2006 | Palmer et al. |
| 2006/0092043 A1 | 5/2006 | Lagassey |
| 2006/0238383 A1 | 10/2006 | Kimchi et al. |
| 2006/0250515 A1 | 11/2006 | Koseki et al. |
| 2006/0256109 A1 | 11/2006 | Acker et al. |
| 2007/0024612 A1 | 2/2007 | Balfour |
| 2007/0046448 A1 | 3/2007 | Smitherman |
| 2007/0237420 A1 | 10/2007 | Steedly et al. |
| 2008/0120031 A1 | 5/2008 | Rosenfeld et al. |
| 2008/0123994 A1 | 5/2008 | Schultz et al. |
| 2008/0158256 A1 | 7/2008 | Russell et al. |
| 2009/0177458 A1 | 7/2009 | Hochart et al. |

(56) References Cited

U.S. PATENT DOCUMENTS

| | | | |
|---|---|---|---|
| 2009/0208095 A1 | 8/2009 | Zebedin | |
| 2009/0237396 A1 | 9/2009 | Venezia et al. | |
| 2009/0304227 A1 | 12/2009 | Kennedy et al. | |
| 2009/0307255 A1* | 12/2009 | Park | G06Q 10/10 |
| 2010/0066559 A1* | 3/2010 | Judelson | G06T 19/00 340/8.1 |
| 2010/0275018 A1* | 10/2010 | Pedersen | G06T 19/00 713/168 |
| 2010/0296693 A1 | 11/2010 | Thornberry et al. | |
| 2011/0033110 A1 | 2/2011 | Shimamura et al. | |
| 2011/0205228 A1 | 8/2011 | Peter et al. | |
| 2011/0270584 A1 | 11/2011 | Plocher et al. | |
| 2013/0246204 A1 | 9/2013 | Thornberry et al. | |
| 2013/0278755 A1* | 10/2013 | Starns | G01C 11/02 348/135 |
| 2014/0095122 A1 | 4/2014 | Appleman et al. | |
| 2014/0267717 A1* | 9/2014 | Pitzer | G01C 15/002 348/143 |
| 2014/0368373 A1* | 12/2014 | Crain | G01S 5/02 342/5 |
| 2016/0055268 A1* | 2/2016 | Bell | G06F 17/5004 703/1 |

FOREIGN PATENT DOCUMENTS

| | | |
|---|---|---|
| CA | 2402234 | 9/2000 |
| CA | 2505566 | 5/2004 |
| CN | 1735897 A | 2/2006 |
| DE | 60017384 T | 3/2006 |
| DE | 60306301 T | 11/2006 |
| DK | 1418402 T | 10/2006 |
| EP | 1010966 | 2/1999 |
| EP | 1180967 | 2/2002 |
| EP | 1418402 | 5/2004 |
| EP | 1696204 | 8/2006 |
| ES | 2266704 T | 3/2007 |
| JP | 2003/317089 A | 11/2003 |
| JP | 2010197100 A | 9/2010 |
| JP | 2010197100 A | 9/2011 |
| MX | PA05004987 | 2/2006 |
| WO | WO99/18732 | 4/1999 |
| WO | WO/2000/053090 | 9/2000 |
| WO | WO/2004/044692 | 5/2004 |
| WO | WO/2005/088251 | 9/2005 |
| WO | WO/2008/028040 | 3/2008 |

OTHER PUBLICATIONS

Ciampa, John A., "Pictometry Digital Video Mapping", SPIE, vol. 2598, pp. 140-148, 1995.
Ciampa, J. A., Oversee, Presented at Reconstruction After Urban earthquakes, Buffalo, NY, 1989.
Dunford et al., Remote Sensing for Rural Development Planning in Africa, The Journal for the International Institute for Aerial Survey and Earth Sciences, 2:99-108, 1983.
Gagnon, P.A., Agnard, J. P., Nolette, C., & Boulianne, M., "A Micro-Computer based General Photogrammetric System", Phtogrammetric Engineering and Remote Sensing, vol. 56, No. 5, pp. 623-625, 1990.
Konecny, G., "Issues of Digital Mapping", Leibniz University Hannover, Germany, GIS Ostrava 2008, Ostrava Jan. 27-30, 2008, pp. 1-8.
Konecny, G., "Analytical Aerial Triangulation with Convergent Photography", Department of Surveying Engineering, University of New Brunswick, pp. 37-57, 1966.
Konecny, G., "Interior Orientation and Convergent Photography", Photogrammetric Engineering, pp. 625-634, 1965.
Graham, Lee A., "Airborne Video for Near-Real-Time Vegetation Mapping", Journal of Forestry, 8:28-32, 1993.
Graham, Horita TRG-50 SMPTE Time-Code Reader, Generator, Window Inserter, 1990.

Hess, L.L., et al., "Geocoded Digital Videography for Validation of Land Cover Mapping in the Amazon Basin", International Journal of Remote Sensing, vol. 23, No. 7, pp. 1527-1555, 2002.
Hinthorne, J., et al., "Image Processing in The Grass GIS", Geoscience and Remote Sensing Symposium, 4:2227-2229, 1991.
Imhof, Ralph K., "Mapping from Oblique Photographs", Manual of Photogrammetry, Chapter 18, 1966.
Jensen, John R., Introductory Digital Image Processing: A Remote Sensing Perspective, Prentice-Hall, 1986; 399 pages.
Lapine, Lewis A., "Practical Photogrammetric Control by Kinematic GPS", GPS World, 1(3):44-49, 1990.
Lapine, Lewis A., Airborne Kinematic GPS Positioning for Photogrammetry—The Determination of the Camera Exposure Station, Silver Spring, MD, 11 pages, at least as early as 2000.
Linden et al., Airborne Video Automated Processing, US Forest Service Internal report, Fort Collins, CO, 1993.
Myhre, Dick, "Airborne Video System Users Guide", USDA Forest Service, Forest Pest Management Applications Group, published by Management Assistance Corporation of America, 6 pages, 1992.
Myhre et al., "An Airborne Video System Developed Within Forest Pest Management—Status and Activities", 10 pages, 1992.
Myhre et al., "Airborne Videography—A Potential Tool for Resource Managers"—Proceedings: Resource Technology 90, 2nd International Symposium on Advanced Technology in Natural Resource Management, 5 pages, 1990.
Myhre et al., Aerial Photography for Forest Pest Management, Proceedings of Second Forest Service Remote Sensing Applications Conference, Slidell, Louisiana, 153-162, 1988.
Myhre et al., "Airborne Video Technology", Forest Pest Management/Methods Application Group, Fort Collins, CO, pp. 1-6, at least as early as Jul. 30, 2006.
Norton-Griffiths et al., 1982. "Sample surveys from light aircraft combining visual observations and very large scale color photography". University of Arizona Remote Sensing Newsletter 82-2:1-4.
Norton-Griffiths et al., "Aerial Point Sampling for Land Use Surveys", Journal of Biogeography, 15:149-156, 1988.
Novak, Rectification of Digital Imagery, Photogrammetric Engineering and Remote Sensing, 339-344, 1992.
Slaymaker, Dana M., "Point Sampling Surveys with GPS-logged Aerial Videography", Gap Bulletin No. 5, University of Idaho, http://www.gap.uidaho.edu/Bulletins/5/PSSwGPS.html, 1996.
Slaymaker, et al., "Madagascar Protected Areas Mapped with GPS-logged Aerial Video and 35mm Air Photos", Earth Observation magazine, vol. 9, No. 1, http://www.eomonline.com/Common/Archives/2000jan/00jan_tableofcontents.html, pp. 1-4, 2000.
Slaymaker, et al., "Cost-effective Determination of Biomass from Aerial Images", Lecture Notes in Computer Science, 1737:67-76, http://portal.acm.org/citation.cfm?id=648004.743267&coll=Guide &dl=, 1999.
Slaymaker, et al., "A System for Real-time Generation of Georeferenced Terrain Models", 4232A-08, SPIE Enabling Technologies for Law Enforcement Boston, MA, ftp://vis-ftp.cs.umass.edu/Papers/schultz/spie2000.pdf, 2000.
Slaymaker, et al.,"Integrating Small Format Aerial Photography, Videography, and a Laser Profiler for Environmental Monitoring", in ISPRS WG III/1 Workshop on Integrated Sensor Calibration and Orientation, Portland, Maine, 1999.
Slaymaker, et al., "Calculating Forest Biomass With Small Format Aerial Photography, Videography and a Profiling Laser", In Proceedings of the 17th Biennial Workshop on Color Photography and Videography in Resource Assessment, Reno, NV, 1999.
Slaymaker et al., Mapping Deciduous Forests in Southern New England using Aerial Videography and Hyperclustered Multi-Temporal Landsat TM Imagery, Department of Forestry and Wildlife Management, University of Massachusetts, 1996.
Star et al., "Geographic Information Systems an Introduction", Prentice-Hall, 1990.
Tomasi et al., "Shape and Motion from Image Streams: a Factorization Method"—Full Report on the Orthographic Case, pp. 9795-9802, 1992.
Warren, Fire Mapping with the Fire Mousetrap, Aviation and Fire Management, Advanced Electronics System Development Group, USDA Forest Service, 1986.

(56) References Cited

OTHER PUBLICATIONS

Welch, R., "Desktop Mapping with Personal Computers", Photogrammetric Engineering and Remote Sensing, 1651-1662, 1989.
Westervelt, James, "Introduction to GRASS 4", pp. 1-25, 1991.
"RGB Spectrum Videographics Report, vol. 4, No. 1, McDonnell Douglas Integrates RGB Spectrum Systems in Helicopter Simulators", pp. 1-6, 1995.
RGB "Computer Wall", RGB Spectrum, 4 pages, 1995.
"The First Scan Converter with Digital Video Output", Introducing . . . The RGB/Videolink 1700D-1, RGB Spectrum, 2 pages, 1995.
ERDAS Field Guide, Version 7.4, A Manual for a commercial image processing system, 1990.
"Image Measurement and Aerial Photography", Magazine for all branches of Photogrammetry and its fringe areas, Organ of the German Photogrammetry Association, Berlin-Wilmersdorf, No. 1, 1958.
"Airvideo Analysis", MicroImages, Inc., Lincoln, NE, 1 page, Dec. 1992.
Zhu, Zhigang, Hanson, Allen R., "Mosaic-Based 3D Scene Representation and Rendering", Image Processing, 2005, ICIP 2005, IEEE International Conference on 1(2005).
Mostafa, et al., "Direct Positioning and Orientation Systems How do they Work? What is the Attainable Accuracy?", Proceeding, American Society of Photogrammetry and Remote Sensing Annual Meeting, St. Louis, MO, Apr. 24-27, 2001.
"POS AV" georeferenced by APPLANIX aided inertial technology, http://www.applanix.com/products/posav_index.php.
Mostafa, et al., "Ground Accuracy from Directly Georeferenced Imagery", Published in GIM International vol. 14 N. Dec. 12, 2000.
Mostafa, et al., "Airborne Direct Georeferencing of Frame Imagery: An Error Budget", The $3^{rd}$ International Symposium on Mobile Mapping Technology, Cairo, Egypt, Jan. 3-5, 2001.
Mostafa, M.R. and Hutton, J., "Airborne Kinematic Positioning and Attitude Determination Without Base Stations", Proceedings, International Symposium on Kinematic Systems in Geodesy, Geomatics, and Navigaiton (KIS 2001) Banff, Alberta, Canada, Jun. 4-8, 2001.
Mostafa, et al., "Airborne DGPS Without Dedicated Base Stations for Mapping Applications", Proceedings of ION-GPS 2001, Salt Lake City, Utah, USA, Sep. 11-14.
Mostafa, "ISAT Direct Exterior Orientation QA/QC Strategy Using POS Data", Proceedings of OEEPE Workshop: Integrated Sensor Orientation, Hanover, Germany, Sep. 17-18, 2001.
Mostafa, "Camera/IMU Boresight Calibration: New Advances and Performance Analysis", Proceedings of the ASPRS Annual Meeting, Washington, D.C., Apr. 21-26, 2002.
Hiatt, "Sensor Integration Aids Mapping at Ground Zero", Photogrammetric Engineering and Remote Sensing, Sep. 2002, p. 877-878.
Mostafa, "Precision Aircraft GPS Positioning Using CORS", Photogrammetric Engineering and Remote Sensing, Nov. 2002, p. 1125-1126.
Mostafa, et al., System Performance Analysis of INS/DGPS Integrated System for Mobile Mapping System (MMS), Department of Geomatics Engineering, University of Calgary, Commission VI, WG VI/4, Mar. 2004.
Artes F., & Hutton, J., "GPS and Inertial Navigation Delivering", Sep. 2005, GEOconnexion International Magazine, p. 52-53, Sep. 2005.
"POS AV" Applanix, Product Outline, airborne@applanix.com, 3 pages, Mar. 28, 2007.
POSTrack, "Factsheet", Applanix, Ontario, Canada, www.applanix.com, Mar. 2007.
POS AV "Digital Frame Camera Applications", 3001 Inc., Brochure, 2007.
POS AV "Digital Scanner Applications", Earthdata Brochure, Mar. 2007.
POS AV "Film Camera Applications" AeroMap Brochure, Mar. 2007.
POS AV "LIDAR Applications" MD Atlantic Brochure, Mar. 2007.
POS AV "OEM System Specifications", 2005.
POS AV "Synthetic Aperture Radar Applications", Overview, Orbisat Brochure, Mar. 2007.
"POSTrack V5 Specifications" 2005.
"Remote Sensing for Resource Inventory Planning and Monitoring", Proceeding of the Second Forest Service Remote Sensing Applications Conference—Slidell, Louisiana and NSTL, Mississippi, Apr. 11-15, 1988.
"Protecting Natural Resources with Remote Sensing", Proceeding of the Third Forest Service Remote Sensing Applications Conference—Apr. 9-13, 1990.
Heipke, et al, "Test Goals and Test Set Up for the OEEPE Test—Integrated Sensor Orientation", 1999.
Kumar, et al., "Registration of Video to Georeferenced Imagery", Sarnoff Corporation, CN5300, Princeton, NJ, 1998.
McConnel, Proceedings Aerial Pest Detection and Monitoring Workshop—1994.pdf, USDA Forest Service Forest Pest Management, Northern Region, Intermountain region, Forest Insects and Diseases, Pacific Northwest Region.
"Standards for Digital Orthophotos", National Mapping Program Technical Instructions, US Department of the Interior, Dec. 1996.
Tao, "Mobile Mapping Technology for Road Network Data Acquisition", Journal of Geospatial Engineering, vol. 2, No. 2, pp. 1-13, 2000.
"Mobile Mapping Systems Lesson 4", Lesson 4 SURE 382 Geographic Information Systems II, pp. 1-29, Jul. 2, 2006.
Konecny, G., "Mechanische Radialtriangulation mit Konvergentaufnahmen", Bildmessung und Luftbildwesen, 1958, Nr. 1.
Myhre, "ASPRS/ACSM/RT 92" Technical papers, Washington, D.C., vol. 5 Resource Technology 92, Aug. 3-8, 1992.
Rattigan, "Towns get new view from above," *The Boston Globe*, Sep. 5, 2002.
Mostafa, et al., "Digital image georeferencing from a multiple camera system by GPS/INS," *ISPRS Journal of Photogrammetry & Remote Sensing*, 56(I): I-12, Jun. 2001.
Dillow, "Grin, or bare it, for aerial shot," *Orange County Register* (California), Feb. 25, 200I.
Anonymous, "Live automatic coordinates for aerial images," *Advanced Imaging*, 12(6):51, Jun. 1997.
Anonymous, "Pictometry and US Geological Survey announce—Cooperative Research and Development Agreement," Press Release published Oct. 20, 1999.
Miller, "Digital software gives small Arlington the Big Picture," *Government Computer NewsState & Local*, 7(12), Dec. 2001.
Garrett, "Pictometry: Aerial photography on steroids," *Law Enforcement Technology* 29(7):114-116, Jul. 2002.
Weaver, "County gets an eyeful," *The Post-Standard* (Syracuse, NY), May 18, 2002.
Reed, "Firm gets latitude to map O.C. in 3D," *Orange County Register* (California), Sep. 27, 2000.
Reyes, "Orange County freezes ambitious aerial photography project," *Los Angeles Times*, Oct. 16, 2000.
Aerowest Pricelist of Geodata as of Oct. 21, 2005 and translations to English 3 pages.
www.archive.org Web site showing archive of German AeroDach Web Site http://www.aerodach.de dated Jun. 13, 2004 (retrieved Sep. 20, 2012) and translations to English 4 pages.
AeroDach® Online Roof Evaluation Standard Delivery Format and 3D Data File: Document Version 01.00.2002 with publication in 2002, 13 pages.
Noronha et al., "Detection and Modeling of Building from Multiple Aerial Images," Institute for Robotics and Intelligent Systems, University of Southern California, Nov. 27, 2001, 32 pages.
Applicad Reports dated Nov. 25, 1999-Mar. 9, 2005, 50 pages.
Applicad Online Product Bulletin archive from Jan. 7, 2003, 4 pages.
Applicad Sorcerer Guide, Version 3, Sep. 8, 1999, 142 pages.
Xactimate Claims Estimating Software archive from Feb. 12, 2010, 8 pages.
Bignone et al, Automatic Extraction of Generic House Roofs from High Resolution Aerial Imagery, Communication Technology

(56) References Cited

OTHER PUBLICATIONS

Laboratory, Swiss Federal Institute of Technology ETH, Ch-8092 Zurich, Switzerland, 12 pages, 1996.
Geospan 2007 Job proposal.
Greening et al., Commercial Applications of GPS-Assisted Photogrammetry, Presented at GIS/LIS Annual Conference and Exposition, Phoenix, AZ, Oct. 1994.
International Search Report and Written Opinion of PCT/US2015/014674, Korean Intellectual Property Office, dated May 8, 2015.
Farin et al., "Floorplan Reconstruction from Panoramic Images" In Proc. of ACM 15th Int. Conf, on Multimedia, 2007, pp. 823-826.
Tarnavsky et al., "Semiautomatic Floor-Plan Reconstruction from a 360° Panoramic Image" In Proc. of 2nd VISAPP Conference, 2012, pp. 345-350.
Roman, "Multiperspective Imaging for Automated Urban Visualization", Doctoral Dissertation, Stanford University, Sep. 2006.
Robertson et al., "Building Architectural Models from Many Views Using Map Constraints", European Conference on Computer Vision: Lecture Notes in Computer Science vol. 2351, 2002, pp. 155-169.
Dunston et al., "An Immersive Virtual Reality Mockup for Design Review of Hospital Patient Rooms", 7th Int. Conf. on Construction Applications of Virtual Reality, 2007.
Rosenberg, "A Room With a View (From Above)", Behold: The Photo Blog, accessed at http://www,slate.com/blogs/behold/2013/01/14/menno_aden_room_portraits_taken_from_above_photos.html, [retrieved on Jun. 9, 2015] Jan. 14, 2013.
Amsbary, "Virtual IKEA: User Interaction in 2d and 3d Spaces", Masters Project, Georgia Institute of Technology, Apr. 11, 2007.
Yin et al., "Generating 3D Building Models from Architectural Drawings: A Survey," IEEE Computer Graphics and Applications, IEEE Computer Society, Jan./Feb. 2009, pp. 20-30.
Aden, "Room Portraits," retrieved from the internet site http://mennoaden.com/room_portraits.html [retrieved on Jun. 9, 2015].
Mitchell, "The World from Above: Menno Aden's 'Room portraits'," Apartment Therapy, retrieved from internet site http://www.apartmenttherapy.com/the-world-from-above-184514 [retrieved on Jun. 9, 2015], Feb. 22, 2013.

* cited by examiner

METHOD AND SYSTEM FOR DISPLAYING ROOM INTERIORS ON A FLOOR PLAN

CROSS REFERENCE TO RELATED APPLICATIONS/INCORPORATION BY REFERENCE STATEMENT

The present patent application incorporates by reference the entire provisional patent application identified by U.S. Ser. No. 61/937,488, filed on Feb. 8, 2014, and claims priority thereto under 35 U.S.C. 119(e).

BACKGROUND

Emergency responders are often called to the scene of an ongoing incident, such as a barricaded gunman or school shooting, and must respond quickly to the incident within a structure, such as a facility and/or building, in which they may not be familiar. In many cases, the first few moments when the first responder arrives may mean life or death for individuals confronted by the situation. While first responders often train on the specific facility to which they must respond, they typically do not have the necessary familiarity to instinctively locate specific rooms within which the events are unfolding.

Currently, there are efforts underway to map major portions of interiors within buildings. These various efforts includes things such as the "interior version" of Google Street View, 360-degree camera systems (e.g., IPIX), and LIDAR mapping of interiors with systems such as Trimble's TIMMS unit. While each system may capture images and/or wall positions, conveyance of the information in a manner that allows a first responder to quickly identify a location is lacking.

The most common manner of displaying information regarding the layout of a room within a structure is through a floor plan. Most people, however, are not trained to use floor plans. Even those trained to review floor plans take time to review and interpret the floor plan in order to assess which room is the desired location and how best to get there. Generally, the view of the walls is missing on floor plans, and this is the way normal people see and interpret interior rooms.

Many systems compensate for the view of the walls by going to a three-dimensional viewer allowing for an operator to move through the structure and see the walls, floors, ceilings, and the like, of rooms within the building. These views, however, do not allow for a quick assessment of the floor plan of the structure where an incident is occurring and quick identification of one or more routes to a particular room within the structure to pursue.

BRIEF DESCRIPTION OF THE SEVERAL VIEWS OF THE DRAWINGS

To assist those of ordinary skill in the relevant art in making and using the subject matter hereof, reference is made to the appended drawings, which are not intended to be drawn to scale, and in which like reference numerals are intended to refer to similar elements for consistency. For purposes of clarity, not every component may be labeled in every drawing.

DETAILED DESCRIPTION

Figure 1:
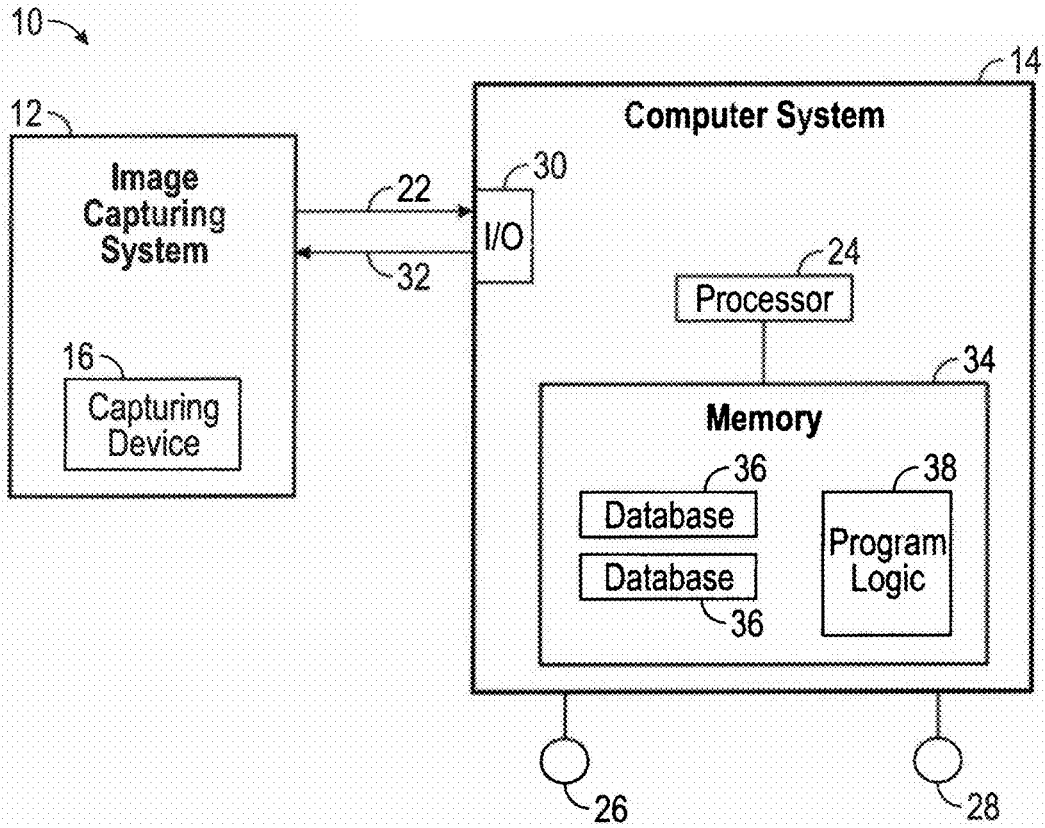
FIG. 1 illustrates a schematic diagram of hardware forming an exemplary embodiment of a system for automatically generating a three dimensional floor plan of a structure. The system includes an image capturing system and a computer system.

Before explaining at least one embodiment of the disclosure in detail, it is to be understood that the disclosure is not limited in its application to the details of construction, experiments, exemplary data, and/or the arrangement of the components set forth in the following description or illustrated in the drawings unless otherwise noted.

The disclosure is capable of other embodiments or of being practiced or carried out in various ways. Also, it is to be understood that the phraseology and terminology employed herein is for purposes of description, and should not be regarded as limiting.

The following detailed description refers to the accompanying drawings. The same reference numbers in different drawings may identify the same or similar elements.

As used in the description herein, the terms "comprises," "comprising," "includes," "including," "has," "having," or any other variations thereof, are intended to cover a non-exclusive inclusion. For example, unless otherwise noted, a process, method, article, or apparatus that comprises a list of elements is not necessarily limited to only those elements, but may also include other elements not expressly listed or inherent to such process, method, article, or apparatus.

Further, unless expressly stated to the contrary, "or" refers to an inclusive and not to an exclusive "or". For example, a condition A or B is satisfied by one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the inventive concept. This description should be read to include one or more, and the singular also includes the plural unless it is obvious that it is meant otherwise. Further, use of the term "plurality" is meant to convey "more than one" unless expressly stated to the contrary.

As used herein, any reference to "one embodiment," "an embodiment," "some embodiments," "one example," "for example," or "an example" means that a particular element, feature, structure or characteristic described in connection with the embodiment is included in at least one embodiment. The appearance of the phrase "in some embodiments" or "one example" in various places in the specification is not necessarily all referring to the same embodiment, for example.

Circuitry, as used herein, may be analog and/or digital components, or one or more suitably programmed processors (e.g., microprocessors) and associated hardware and software, or hardwired logic. Also, "components" may perform one or more functions. The term "component," may include hardware, such as a processor (e.g., microprocessor), an application specific integrated circuit (ASIC), field programmable gate array (FPGA), a combination of hardware and software, and/or the like. The term "processor" as used herein means a single processor or multiple processors working independently or together to collectively perform a task.

Software may include one or more computer readable instructions that when executed by one or more components cause the component to perform a specified function. It should be understood that the algorithms described herein may be stored on one or more non-transient memory. Exemplary non-transient memory may include random access memory, read only memory, flash memory, and/or the like. Such non-transient memory may be electrically based, optically based, and/or the like.

It is to be further understood that, as used herein, the term user is not limited to a human being, and may comprise, a computer, a server, a website, a processor, a network interface, a human, a user terminal, a virtual computer, combinations thereof, and the like, for example.

Referring now to the Figures, and in particular to FIG. 1, shown therein is a schematic diagram of hardware forming an exemplary embodiment of an apparatus 10 for automatically generating a three dimensional floor plan of a structure. Generally, the three-dimensional floor plan of the structure includes multi-three dimensional perspective floor plan (i.e., multi-3D perspective floor plan) of real-life physical characteristics of walls and/or a floor of the structure created from a floor plan and image data. The multi-3D perspective floor plan provides a three-dimensional fitted representation of real-life physical characteristics. For example, for an interior room, the three dimensional fitted representation of real-life physical characteristics may include a set of walls of the interior room from an overhead perspective in a nadir direction from a viewpoint located between two walls, such as at a center of the room. Each room may have a different perspective such that for a first room and a second room, a first three dimensional fitted representation of real-life physical characteristics of the walls of the first room may be from a first perspective having a first viewing direction extending from a first viewing location. A second three-dimensional fitted representation of real-life physical characteristics of the walls of the second room may be from a second perspective with a second viewing direction extending from a second viewing location. The first viewing direction may differ from the second viewing direction and/or the first viewing location may differ from the second viewing location.

In some embodiments, the apparatus 10 includes a computer system for storing a database of three-dimensional floor plans of structures with corresponding geo-location data identifying the structures within the database. The geo-location data can be an address (street, city and/or zip code) for each structure or one or more geospatial coordinates such as latitude/longitude. The computer system has computer executable logic that, when executed by a processor, causes the computer system to receive a geographic point from a user, search the database to find three-dimensional floor plans that correspond to the geographic point, and make the three-dimensional floor plans that contain the geographic point available to the user.

In another embodiment, a method of providing three-dimensional floor plans of structures to a user with the apparatus 10 includes the following steps. The apparatus 10 includes a database hosted by a computer system that stores data indicative of a plurality of floor plans of structures with corresponding geo-location data identifying the structures within the database. The floor plans have a room(s) comprising a set of walls and a floor between the walls in the set, and a set of image data depicting the walls and the floor of the room(s). Image data may include, but is not limited to, captured images, computer-aided design (CAD) images, hand drawn images, and/or the like. A selection of a geographic point is received by one or more I/O ports of a computer system hosting the database from a user and the database is then searched to find floor plans that contain the selected geographic point and the set of image data depicting the walls and the floor of the room(s). The floor plans and the set of image data depicting the walls and the floor of the floor plan that contain the selected geographic point are then made available to the user via the one or more I/O port of the computer system.

In some embodiments, the apparatus 10 may include an image capturing system 12 and one or more computer systems 14. Alternatively, the apparatus 10 may solely include one or more computer systems 14, with the apparatus obtaining image data (e.g., one or more images) from a third party system. To that end, in some embodiments, the image capturing system 12 may obtain image data, in addition to, image data obtained from a third party system.

In some embodiments, the image capturing system 12 may include one or more capturing devices 16 collecting one or more images of an interior of a structure. For example, the image capturing system 12 may include one or more capturing devices 16 collecting one or more images of a floor and/or walls of an interior room. For simplicity in description, the following disclosure may relate to an interior room including the floor and walls of the interior rooms, however, it should be noted that one skilled in the art will appreciate that the system and methods as disclosed herein may be applied to any structure and is not limited to interior rooms.

The capturing device 16 may be capable of capturing images photographically and/or electronically. The capturing device 16 may include known or determinable characteristics including, but not limited to, focal length, sensor size, aspect ratio, radial and other distortion terms, principal point offset, pixel pitch, alignment, and/or the like. Generally, the capturing device 16 may provide one or more images from a viewing location within the room that extends in a viewing direction to provide a particular perspective of physical characteristics within the interior of the room.

In some embodiments, the capturing device 16 of the image capturing system 12 may include, but is not limited to, one or more conventional cameras, digital cameras, digital sensors, charge-coupled devices, and/or the like. For example, in one example, the capturing device 16 may be one or more conventional cameras manually operated by a user positioned within an interior of the room to collect one or more images of the floor and/or walls of the room.

In another example, the capturing device 16 of the image capturing system 12 may include one or more 360-degree camera systems collecting one or more images of the floor and/or walls of the interior room. For example, the capturing device 16 may include a 360-degree camera system such as the IPIX system, manufactured by IPIX Corporation. The 360-degree camera system may include one or more ultra-wide fish-eye lenses capable of capturing the room in two or more images. Such images may be stitch together to form one or more contiguous views of at least a portion or the entire room. In some embodiments, the imagery may then be displayed in a viewer (e.g., IPIX viewer). Each wall and/or the floor of the interior room may be extracted into separate images for processing as described in further detail herein.

Figure 2:
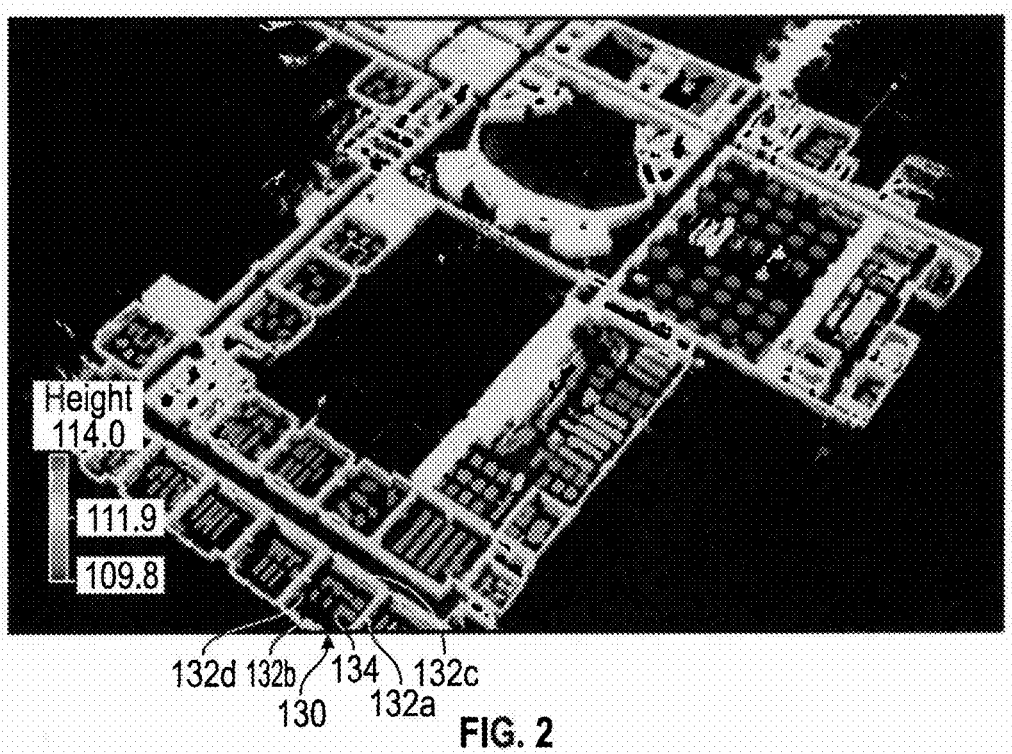
FIG. 2 illustrates an exemplary three-dimensional model floor plan created using a LiDAR scanner of the image capturing system illustrated in FIG. 1.

In another example, the capturing device 16 of the image capturing system 12 may include one or more scanners. For example, the capturing device 16 may use a LiDAR scanner, such as the Trimble TIMMS unit, distributed by Applanix based in Richmond Hill, Ontario. The room scanner may be used to collect three-dimensional data points of the floor and/or walls and form a three-dimensional model of the interior room. The three-dimensional data points may be loaded into the three-dimensional model viewer. FIG. 2 illustrates an exemplary three-dimensional model floor plan 20 created using a LiDAR scanner. One or more walls and/or the floor may be projected and extracted into separate images for processing as described in further detail herein.

In some embodiments, the image capturing system 12 may further include a RGB sensor. The RGB sensor may be used in addition to the room scanner to enhance color of acquired images. For example, the RBG sensor may provide color representation to the three-dimensional data points collected by a LiDAR scanner.

The capturing device 16 may acquire image data including, but not limited to, one or more images, and issue one or more image data signals (IDS) 22 corresponding to the particular image data acquired (e.g., one or more particular images and/or photographs). The image data may be stored in the computer system 14. In addition, the image capturing system 12 may further include a positioning and orientation device, such as a GPS and/or, an inertial measurement unit, which collects data indicative of a three-dimensional location of the sensor of the capturing device 16, an orientation of the sensor, as well as compass direction of the sensor each time the images and/or photographs are acquired.

Referring to FIG. 1, the computer system 14 may be a system or systems that are able to embody and/or execute the logic of the processes described herein. Logic embodied in the form of software instructions and/or firmware may be executed on any appropriate hardware. For example, logic embodied in the form of software instructions or firmware may be executed on a dedicated system or systems, or on a personal computer system, or on a distributed processing computer system, and/or the like. In some embodiments, logic may be implemented in a stand-alone environment operating on a single computer system and/or logic may be implemented in a networked environment, such as a distributed system using multiple computers and/or processors.

In some embodiments, the computer system 14 may include one or more processors 24 communicating with one or more input devices 26, output devices 28, and/or I/O ports 30 enabling the input and/or output of data to and from the computer system 14 to the image capturing system 12 and/or a user. As used herein, the term "user" is not limited to a human, and may comprise a human using a computer, a host system, a smart phone, a tablet, a computerized pen or writing device, combinations thereof, and/or the like, for example, but not by way of limitation.

The one or more input devices 26 may be capable of receiving information input from a user and/or one or more processors, and transmitting such information to the processor 24. The one or more input devices 26 may include, but are not limited to, implementation as a keyboard, touchscreen, mouse, trackball, microphone, fingerprint reader, infrared port, slide-out keyboard, flip-out keyboard, cell phone, PDA, video game controller, remote control, fax machine, network interface, speech recognition, gesture recognition, eye tracking, brain-computer interface, combinations thereof, and/or the like.

The one or more output devices 28 may be capable of outputting information in a form perceivable by a user and/or processor(s). For example, the one or more output devices 28 may include, but are not limited to, implementations as a computer monitor, a screen, a touchscreen, a speaker, a website, a television set, a smart phone, a PDA, a cell phone, a fax machine, a printer, a laptop computer, an optical head-mounted display (OHMD), combinations thereof, and/or the like. It is to be understood that in some exemplary embodiments, the one or more input devices 26 and the one or more output devices 28 may be implemented as a single device, such as, for example, a touchscreen or a tablet.

In some embodiments, output of information in a form perceivable by a user and/or processor may comprise displaying or providing for display a webpage (e.g., webpage having one or more images and software to permit formation of a floor plan), electronic communications, e-mail, and/or electronic correspondence to one or more user terminals interfacing with a computer and/or computer network(s) and/or allowing the one or more users to participate, such as by interacting with one or more mechanisms on a webpage, electronic communications, e-mail, and/or electronic correspondence by sending and/or receiving signals (e.g., digital, optical, and/or the like) via a computer network interface (e.g., Ethernet port, TCP/IP port, optical port, cable modem, combinations thereof, and/or the like). A user may be provided with a web page in a web browser, or in a software application, for example.

The image data signals 22 may be provided to the computer system 14. For example, the image data signals 22 may be received by the computer system 14 via the I/O port 30. The I/O port 30 may comprise one or more physical and/or virtual ports.

In some embodiments, the computer system 14 may issue an image capturing signal 32 to the image capturing system 12 to thereby cause the capturing device 16 to acquire and/or capture an image at a predetermined location and/or at a predetermined interval. Additionally, in some embodiments, the image capturing signal 32 may be a point collection signal given to a room scanner (e.g., LiDAR scanner) to thereby cause the room scanner to collect points at a predetermined location and/or at a predetermined interval.

The computer system 14 may include one or more processors 24 working together, or independently to execute processor executable code, and one or more memories 34 capable of storing processor executable code. In some embodiments, each element of the computer system 14 may be partially or completely network-based or cloud-based, and may or may not be located in a single physical location.

The one or more processors 24 may be implemented as a single or plurality of processors working together, or independently, to execute the logic as described herein. Exemplary embodiments of the one or more processors 24 may include, but are not limited to, a digital signal processor (DSP), a central processing unit (CPU), a field programmable gate array (FPGA), a microprocessor, a multi-core processor, and/or combination thereof, for example. The one or more processors 24 may be capable of communicating via a network (e.g., analog, digital, optical, and/or the like) via one or more ports (e.g., physical or virtual ports) using a network protocol. It is to be understood, that in certain embodiments, using more than one processor 24, the processors 24 may be located remotely from one another, in the same location, or comprising a unitary multi-core processor. The one or more processors 24 may be capable of reading and/or executing processor executable code and/or capable of creating, manipulating, retrieving, altering, and/or storing data structures into one or more memories 34.

The one or more memories 34 may be capable of storing processor executable code. Additionally, the one or more memories 34 may be implemented as a conventional non-transient memory, such as, for example, random access memory (RAM), a CD-ROM, a hard drive, a solid state drive, a flash drive, a memory card, a DVD-ROM, a floppy disk, an optical drive, combinations thereof, and/or the like, for example.

In some embodiments, the one or more memories 34 may be located in the same physical location as the computer system 14. Alternatively, one or more memories 34 may be located in a different physical location as the computer system 14, with the computer system 14 communicating with one or more memories 34 via a network, for example. Additionally, one or more of the memories 34 may be implemented as a "cloud memory" (i.e., one or more memories 34 may be partially or completely based on or accessed using a network, for example).

Referring to FIG. 1, the one or more memories 34 may store processor executable code and/or information comprising one or more databases 36 and program logic 38. For example, in some embodiments, the database 36 may be hosted by the computer system 14 and stores data indicative of a plurality of floor plans of structures with corresponding geo-location data identifying the structures within the database. The floor plans have one or more rooms comprising a set of walls and a floor between the walls in the set, and a set of image data depicting the walls and the floor of the room(s). In some embodiments, the processor executable code may be stored as a data structure, such as a database and/or data table, for example. The geo-location data can be an address (street, city and/or zip code) for each structure or one or more geospatial coordinates such as latitude/longitude.

Figure 3:
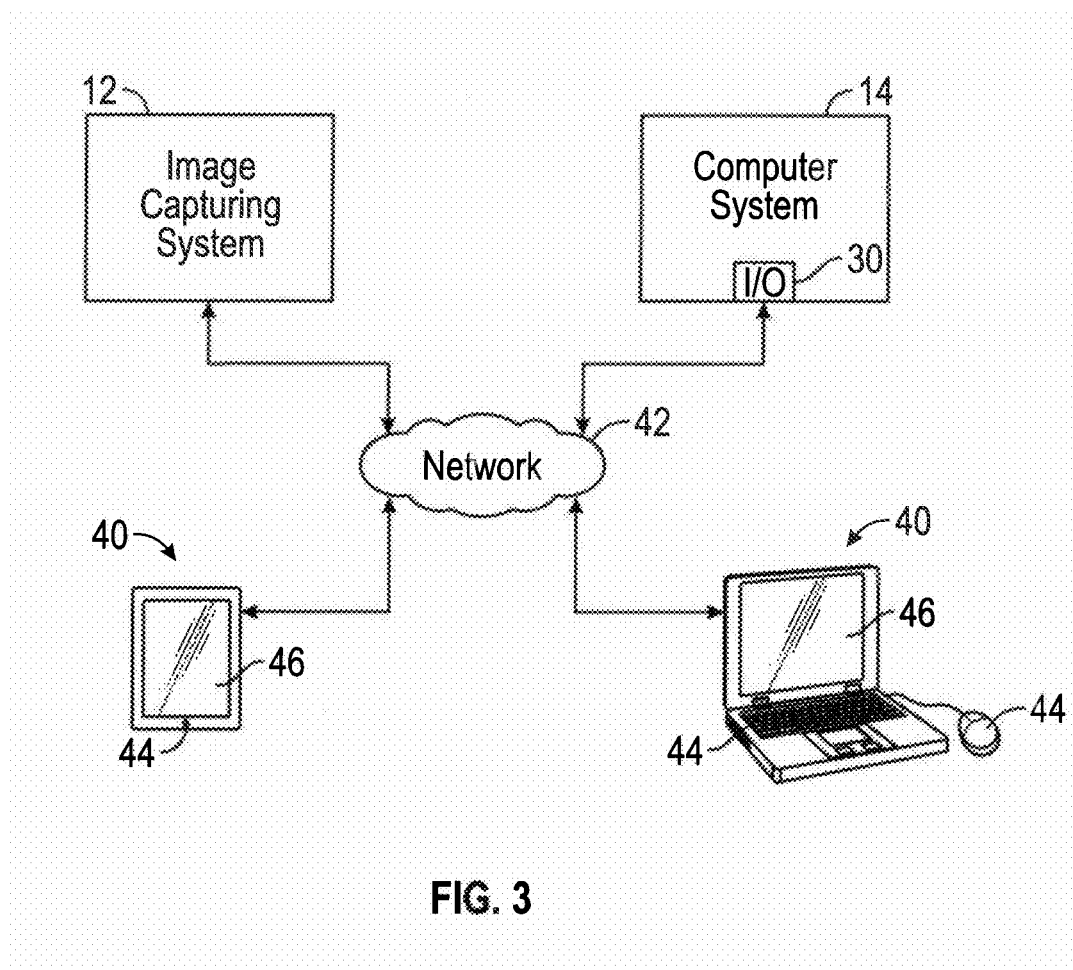
FIG. 3 illustrates a schematic diagram of the system illustrated in FIG. 1, communicating via a network with multiple processors.

Referring to FIG. 3, in some embodiments, the computer system 14 and/or the image capturing system 12 may be in communication with one or more additional processors 40. In this example, the computer system 14 may communicate with the one or more additional processors 40 via a network 42. As used herein, the terms "network-based", "cloud-based", and any variations thereof, may include the provision of configurable computational resources on demand via interfacing with a computer and/or computer network, with software and/or data at least partially located on the computer and/or computer network, by pooling processing power of two or more networked processors.

In some embodiments, the network 42 may be the Internet and/or other network. For example, if the network 42 is the Internet, a primary user interface of the image capturing software and/or image manipulation software may be delivered through a series of web pages. It should be noted that the primary user interface of the image capturing software and/or image manipulation software may be replaced by another type of interface, such as, for example, a Windows-based application.

The network 42 may be almost any type of network. For example, the network 42 may interface by optical and/or electronic interfaces, and/or may use a plurality of network topographies and/or protocols including, but not limited to, Ethernet, TCP/IP, circuit switched paths, and/or combinations thereof. For example, in some embodiments, the network 42 may be implemented as the World Wide Web (or Internet), a local area network (LAN), a wide area network (WAN), a metropolitan network, a wireless network, a cellular network, a Global System for Mobile Communications (GSM) network, a code division multiple access (CDMA) network, a 3G network, a 4G network, a satellite network, a radio network, an optical network, a cable network, a public switched telephone network, an Ethernet network, combinations thereof, and/or the like. Additionally, the network 42 may use a variety of network protocols to permit bi-directional interface and/or communication of data and/or information. It is conceivable that in the near future, embodiments of the present disclosure may use more advanced networking topologies.

The computer system 14 and image capturing system 12 may be capable of interfacing and/or communicating with the one or more computer systems including processors 40 via the network 42. Additionally, the one or more processors 40 may be capable of communicating with each other via the network 42. For example, the computer system 14 may be capable of interfacing by exchanging signals (e.g., analog, digital, optical, and/or the like) via one or more ports (e.g., physical ports or virtual ports) using a network protocol, for example.

The processors 40 may include, but are not limited to implementation as a variety of different types of computer systems, such as a server system having multiple servers in a configuration suitable to provide a commercial computer based business system (such as a commercial web-site), a personal computer, a smart phone, a network-capable television set, a television set-top box, a tablet, an e-book reader, a laptop computer, a desktop computer, a network-capable handheld device, a video game console, a server, a digital video recorder, a DVD player, a Blu-Ray player, a wearable computer, a ubiquitous computer, combinations thereof, and/or the like. In some embodiments, the computer systems comprising the processors 40 may include one or more input devices 44, one or more output devices 46, processor executable code, and/or a web browser capable of accessing a website and/or communicating information and/or data over a network, such as network 42. The computer systems comprising the one or more processors 40 may include one or more non-transient memory comprising processor executable code and/or software applications, for example. The computer system 14 may be modified to communicate with any of these processors 40 and/or future developed devices capable of communicating with the computer system 14 via the network 42.

The one or more input devices 44 may be capable of receiving information input from a user, processors, and/or environment, and transmit such information to the processor 40 and/or the network 42. The one or more input devices 44 may include, but are not limited to, implementation as a keyboard, touchscreen, mouse, trackball, microphone, fingerprint reader, infrared port, slide-out keyboard, flip-out keyboard, cell phone, PDA, video game controller, remote control, fax machine, network interface, speech recognition, gesture recognition, eye tracking, brain-computer interface, combinations thereof, and/or the like.

The one or more output devices 46 may be capable of outputting information in a form perceivable by a user and/or processor(s). For example, the one or more output devices 46 may include, but are not limited to, implementations as a computer monitor, a screen, a touchscreen, a speaker, a website, a television set, a smart phone, a PDA, a cell phone, a fax machine, a printer, a laptop computer, an optical head-mounted display (OHMD), combinations thereof, and/or the like. It is to be understood that in some exemplary embodiments, the one or more input devices 44 and the one or more output devices 46 may be implemented as a single device, such as, for example, a touchscreen or a tablet.

Referring to FIGS. 1 and 3, in use, the computer system 14 may execute the program logic 38 controlling the reading, manipulation, and/or storing of the image data signal(s) 22. For example, the program logic 38 may cause the processor to generate one or more output signals indicative of a multi-3D perspective floor plan created from one or more floor plans and one or more sets of image data.

In some embodiments, the location, orientation and/or compass direction of the one or more capturing devices 16 relative to the floor and/or walls at the precise moment each image is captured may be recorded within the one or more memories 34. Location data may be associated with the corresponding captured image. Such location data may be included within the image data signals 22.

The one or more processors 24 may create and/or store in the one or more memories 34, one or more output image and data files. For example, the processor 24 may convert image data signals 22 into computer-readable output image, data files, and/or LIDAR 3D point cloud files. The output image, data files, and/or LIDAR 3D point cloud files may include a plurality of captured image data corresponding to captured images, positional data, and/or LIDAR 3D point clouds corresponding thereto.

Output image, data files, and/or LIDAR 3D point cloud files may then be further provided, displayed and/or used for generating a multi-3D perspective floor plan of an interior room. The multi-3D perspective floor plan of the interior room includes a three-dimensional fitted representation of real-life physical characteristics of an interior of the room.

Figure 4A:
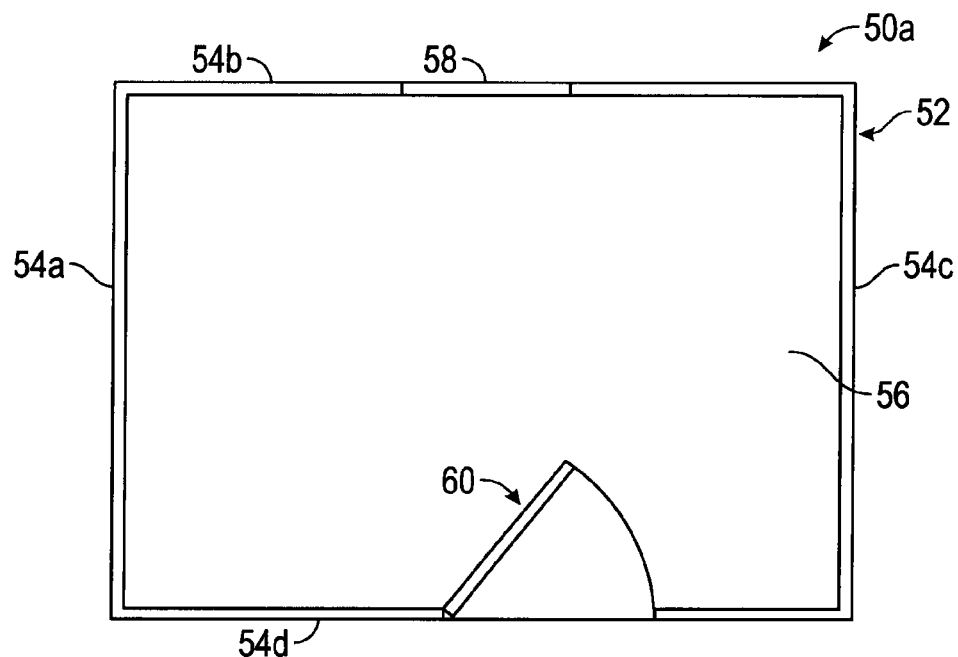
FIG. 4A illustrates an exemplary prior art floor plan depicting an overhead view of an interior room having walls and a floor positioned between the walls.

The most common method of displaying information regarding layout of room(s) within a structure currently within the art is a floor plan. FIG. 4A illustrates an exemplary floor plan 50*a* as is currently known within the art. The floor plan 50*a* depicts an overhead view of an interior room 52 having walls 54*a-d* and a floor 56. Positioned on wall 54*b* is a symbol 58 commonly used within the art to represent a window. Positioned on wall 54*d* is a symbol 60 commonly used within the art to represent a door. Symbols, such as symbols 58 and 60, do not provide real-life physical characteristics of the interior room 52 but merely show a representation of location of the window and door respectively.

Figure 4B:
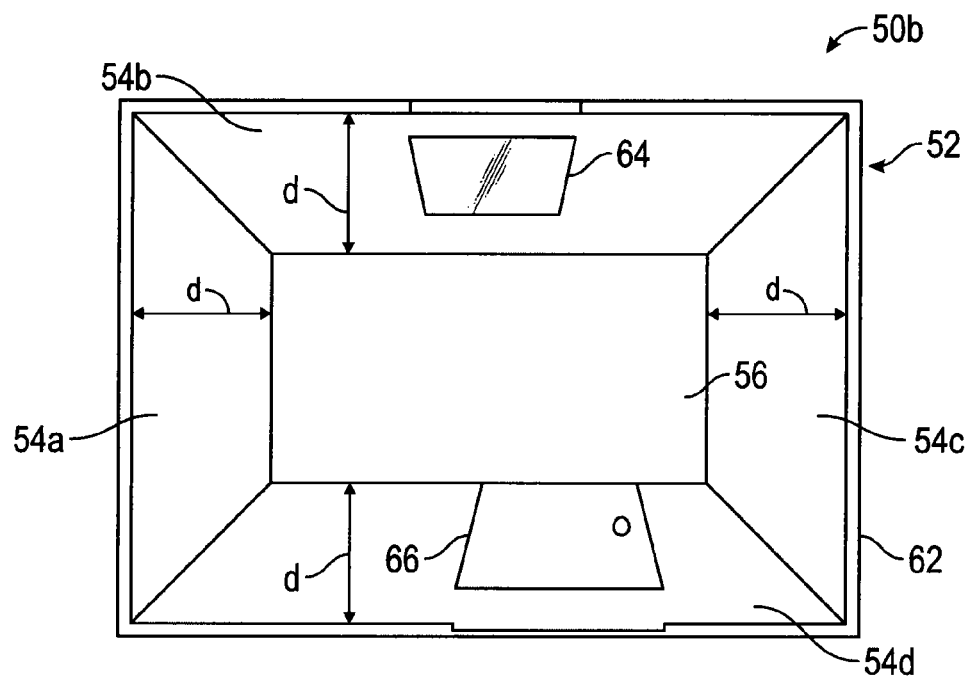
FIG. 4B illustrates an exemplary multi-3D perspective floor plan depicting an overhead view of the interior room in FIG. 4A, wherein elements on the walls are visible from the overhead view.

FIG. 4B illustrates a multi-3D perspective floor plan 50*b* of the interior room 52 of FIG. 4B having a multi-3D perspective real-life characteristics of the room including the walls 54*a-d* and the floor 56. The multi-3D perspective floor plan 50*b* again depicts an overhead view of the interior room 52; however, each wall 54*a-d* is extracted, with the floor 56 resized and positioned at a distance d from an outline 62 of the interior room 52. Providing the distance d between the floor 56 and the outline 62 of the interior room 52, allows the perspective to include views of the walls 54*a-d* such that real life physical characteristics within and on the walls may be illustrated. For example, a window 64 positioned on the wall 54*b* is illustrated in the multi-3D perspective floor plan 50*b* of FIG. 4B as compared to representation by the symbol 58 in floor plan 50*a* of FIG. 4A. Similarly, the door 66 positioned on the wall 54*d* is illustrated in the multi-3D perspective floor plan 50*b* of FIG. 4B as compared to representation by the symbol 60 in the floor plan 50*a* of FIG. 4A. Real-life physical characteristics may be further added to the walls 54*a-d* and/or floor 56 using images and/or data as described in further detail herein.

Images and/or data may further provide users with a quick reference and visual representation of the interior room. Emergency responders are often called to a scene of an incident in progress and must respond quickly within a structure. The emergency responder may have limited knowledge regarding elements (e.g., doors, windows, location of interior rooms) within the structure. Using images and/or image data, the multi-3D perspective floor plan 50*b* may provide an overhead representation that includes real-life physical characteristics of the walls of the interior room.

Figure 4C:
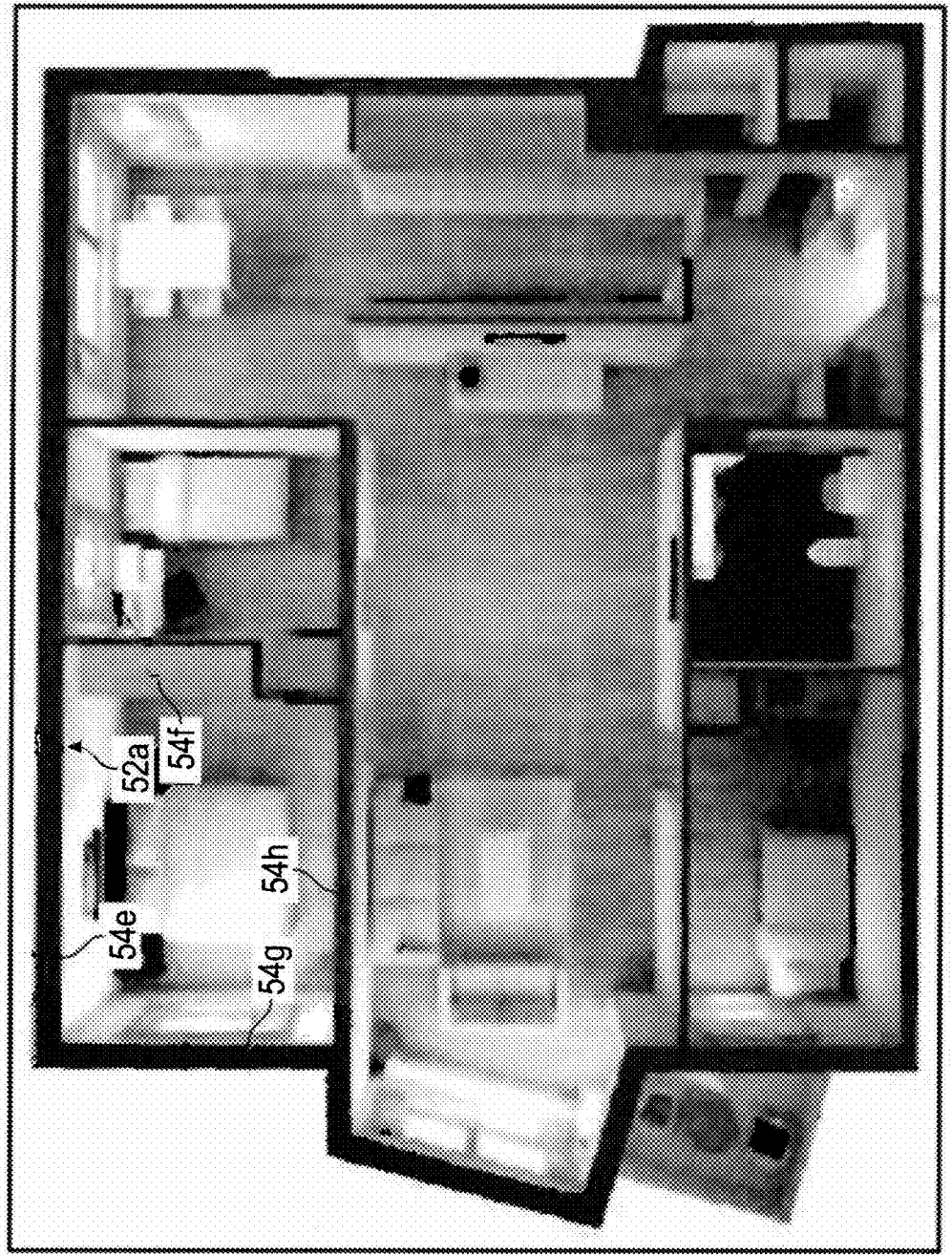
FIG. 4C illustrates an exemplary prior art floor plan depicting a single perspective view of multiple interior rooms.

The multi-3D perspective floor plan 50*b* provided in FIG. 4B and disclosed herein may also be further compared to perspective views commonly provided within the art. For example, FIG. 4C illustrates a perspective floor plan 50*c* of a single view perspective currently used within the art. Generally, the perspective floor plan 50*c* depicts an overhead view; however, physical characteristics on one or more interior walls 54 may not be visible as the perspective floor plan 50*c* is presented from a single perspective in such two-dimensional representations of three-dimensional floor plans. For example, in the room 52*a*, physical characteristics on two walls 54*e* and 54*g* may be visible; however, on walls 54*f* and 54*h*, physical characteristics are not visible in the room 52*a*.

Figure 5:
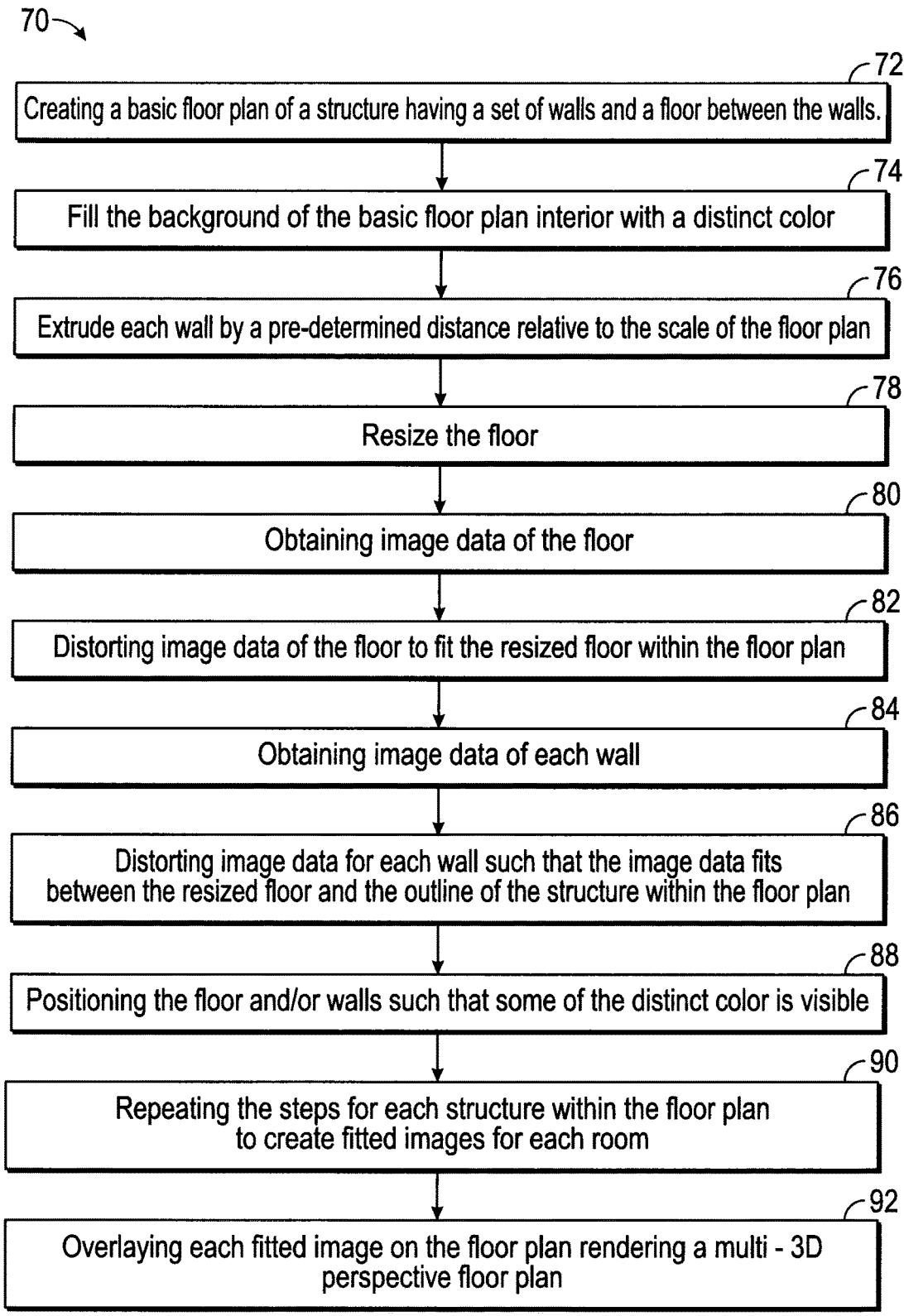
FIG. 5 is a flow chart of an exemplary method for generating a multi-3D perspective floor plan having real-life physical characteristics of a set of walls and a floor of an interior room in accordance with the present disclosure.

FIG. 5 illustrates a flow chart 70 of an exemplary method for generating the multi-3D perspective floor plan 50*b* created from one or more floor plans and one or more sets of image data using the computer system 14. It should be apparent to one skilled in the art that additional interior rooms 52 and/or walls 54 may be included within the multi-3D perspective floor plan 50*b*.

Generally, the multi-3D perspective floor plan 50*b* may allow a first responder to quickly visualize a three-dimensional representation of the interior room 52 while viewing an entire floor plan at once. As such, elements of interest within the structure (e.g., real-life physical characteristics) may be quickly identified and distinguished relative to other objects within the structure. For example, within a school, interior rooms such as auditoriums, swimming pools, boiler rooms, may be quickly identified and distinguished relative to regular classrooms by visually identifying specifics characteristics (e.g., desks) of the rooms.

Additionally, the multi-3D perspective floor plan 50b may provide a first responder with an instinctive feel for objects and/or characteristics within the interior room 52. For example, by providing real-life physical characteristics on the walls 54 and the floor 56, the first responder may be able to determine the number and magnitude of windows, whether there is sufficient cover within the room, and/or other information not readily obtained via the basic floor plan 50a illustrated in FIG. 4A or the perspective floor plan 50c illustrated in FIG. 4C.

Referring to FIG. 5, in a step 72, a basic floor plan, similar to the floor plan 50a of FIG. 4A may be created and/or obtained. The floor plan 50a may include an overhead view of the interior room 52 having one or more walls 54 and the floor 56 between the walls 54. In some embodiments, the floor plan 50a may include multiple rooms. In embodiments having multiple rooms, rooms may be contiguous, adjoining, and/or separate rooms.

In a step 74, the background of the floor plan 50a may be filled with a distinct color. For example, in some embodiments, the background of the floor plan 50a may be filled with pure red (RGB 255, 0, 0). Filling the background of the floor plan 50a may aid in providing three-dimensional conceptual features as discussed in further detail herein.

In a step 76, each wall 54 may be extracted within the floor plan 50a to provide a fitted representation of each wall. For example, each view of each wall 54 may be formed within the multi-3D perspective floor plan 50b by extracting the wall 54a distance d from the outline 62 of the interior room 52. The distance d is determined relative to the scale of the floor plan 50a. The distance d may be a number of pixels or a percentage of an area of the floor 56 and determined such that elements of each wall 54 may be visually represented without also obscuring the floor 56. Although in FIG. 4B, the distance d is used for each wall 54a-d, it should be noted, that each wall may be extracted such that distance d may vary from one wall versus another wall. Alternatively, each wall 54a-d may be extracted such that the distance d of each wall may be substantially similar. In a step 78, the floor 56 may be resized to accommodate the extracted walls 54.

In a step 80, in each interior room 52 of the multi-3D perspective floor plan 50b, image data (e.g., one or more images, CAD images, and/or data renderings) of the floor 56 may be obtained. In one example, image data of the floor 56 may be obtained from the image capturing system 12 via the computer system 14. In another example, image data of the floor 56 may be obtained from a third party system.

In some embodiments, the image data may be obtained via the one or more additional processors 40. For example, in some embodiments, a user may obtain images of the interior room 52 and provide the images to the computer system 14 via the network 42. In another example, image data may be obtained via a third party system and accessed via the network 42. For example, one or more images and/or data renderings may be obtained via an image database from a third party system. The computer system 14 may access the third party system via the network 42 storing and/or manipulating the images with memory 34.

In a step 82, image data of the floor 56 may be fitted to the resized floor 56 within the multi-3D perspective floor plan 50b. For example, one or more images of the floor 56 may be scaled, rotated, and/or otherwise distorted to fit the sizing of the floor 56 within the multi-3D perspective floor plan 50b.

In a step 84, image data for each wall 54 may be obtained. Similar to image data of the floor 56, in some embodiments, image data of each wall 54 may be obtained from the image capturing system 12 via the computer system 14, from a third party system, by users via the one or more additional processors 40, via a third party system accessed via the network 42, and/or the like.

In a step 86, the image data (e.g., one or more images) for each wall 54 may be fitted within the space provided between the resized floor 56 and the outline 62 of the interior room 52. For example, one or more images of each wall 54 may be scaled, rotated, and/or otherwise distorted to fit the spacing between the resized floor 56 and the outline 62 of the interior room 52 to provide a 3D fitted representation of real-life physical characteristics of the walls 54 from a particular perspective (e.g., overhead perspective) having a particular viewing direction extending from a viewing location (e.g. nadir).

Figure 6:
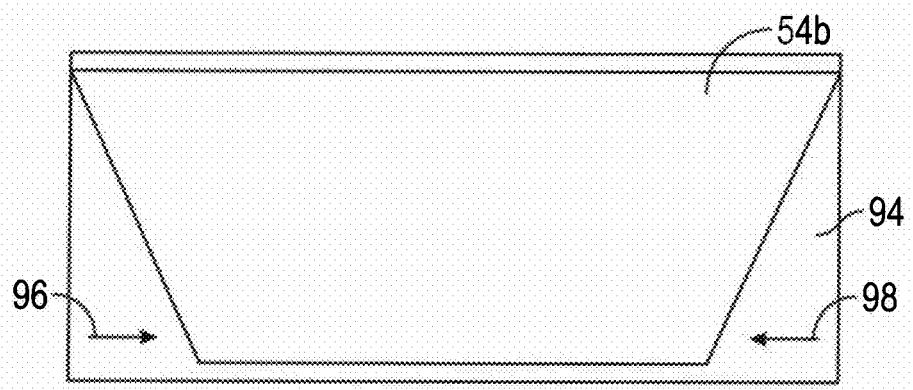
FIG. 6 illustrates a cross-sectional view of the multi-3D perspective floor plan in which a first wall is skewed in a first direction and a second wall is skewed in a second direction.

In some embodiments, fitting image data to each wall 54 to fit the spacing between the resized floor 56 and the outline 62 of the interior room 52 may further include skewing the image. For example, FIG. 6 illustrates an exemplary image 94 associated with the wall 54b of FIG. 4B. For the image 94 to fit within the confines of the wall 54b, the image is skewed in a first direction 96 and a second direction 98, generally towards each other. Skewing of the image 94 may aid in creating the three-dimensional perspective of real-life physical characteristics of the wall 54b. In some embodiments, skewing of the image may be manually or automatically generated by the computer system 14.

In a step 88, one or more three dimensional conceptual features may be optionally added to the multi-3D perspective floor plan 50b. For example, in the step 74 the background of the interior room 52 may be filled with the distinct color (e.g., RGB (255, 0, 0). Positioning the floor 56 and/or walls 54 such that the distinct color is shown may extrude depth and present cues to the human brain to visualize a three-dimensional structure.

Figure 7:
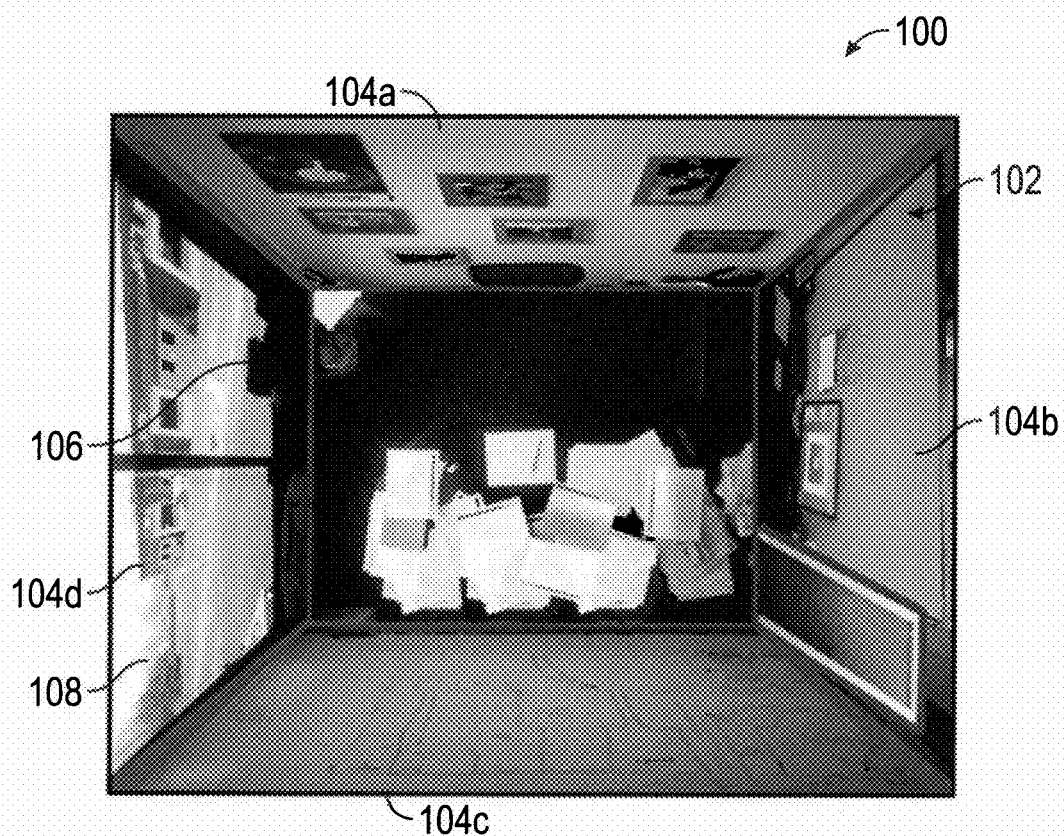
FIG. 7 illustrates an exemplary multi-3D perspective floor plan having real-life physical characteristics of a set of walls and a floor of a structure from an overhead view.

In a step 90, the steps above may be repeated for each room, hallway, and/or structure having associated images and/or data such that multi-3D perspective fitted images having real-life physical characteristics for each interior room 52 may be created. For example, FIG. 7 illustrates an exemplary fitted image 100 (or floor plan 100) of a room 102 having multiple walls 104a-104d and a floor 106. The multi-3D perspective fitted image 100 of the room 102 provides real-life physical characteristics via three-dimensional fitted representations of the real-life characteristics of the imagery and/or data of the walls 104a-104d and the floor 106 from a particular perspective (e.g., overhead perspective). Items on the walls 104a-104d and within the room 102 provide real-life characteristics not seen within typical floor plan views. For example, on the wall 104d, the magnitude and location of a window 108 may be seen via the fitted view provided on the wall 104d. Even further, each wall 104a-104d within the room 102 provides such real-life characteristics as the perspective is not limited to a single direction.

In a step 92, once imagery for the interior room 52 has been scaled, rotated, and/or modified, each image and/or a composite image of the interior room 52 may be overlaid on the floor plan rendering a multi-3D perspective floor plan representation.

Figure 8A:
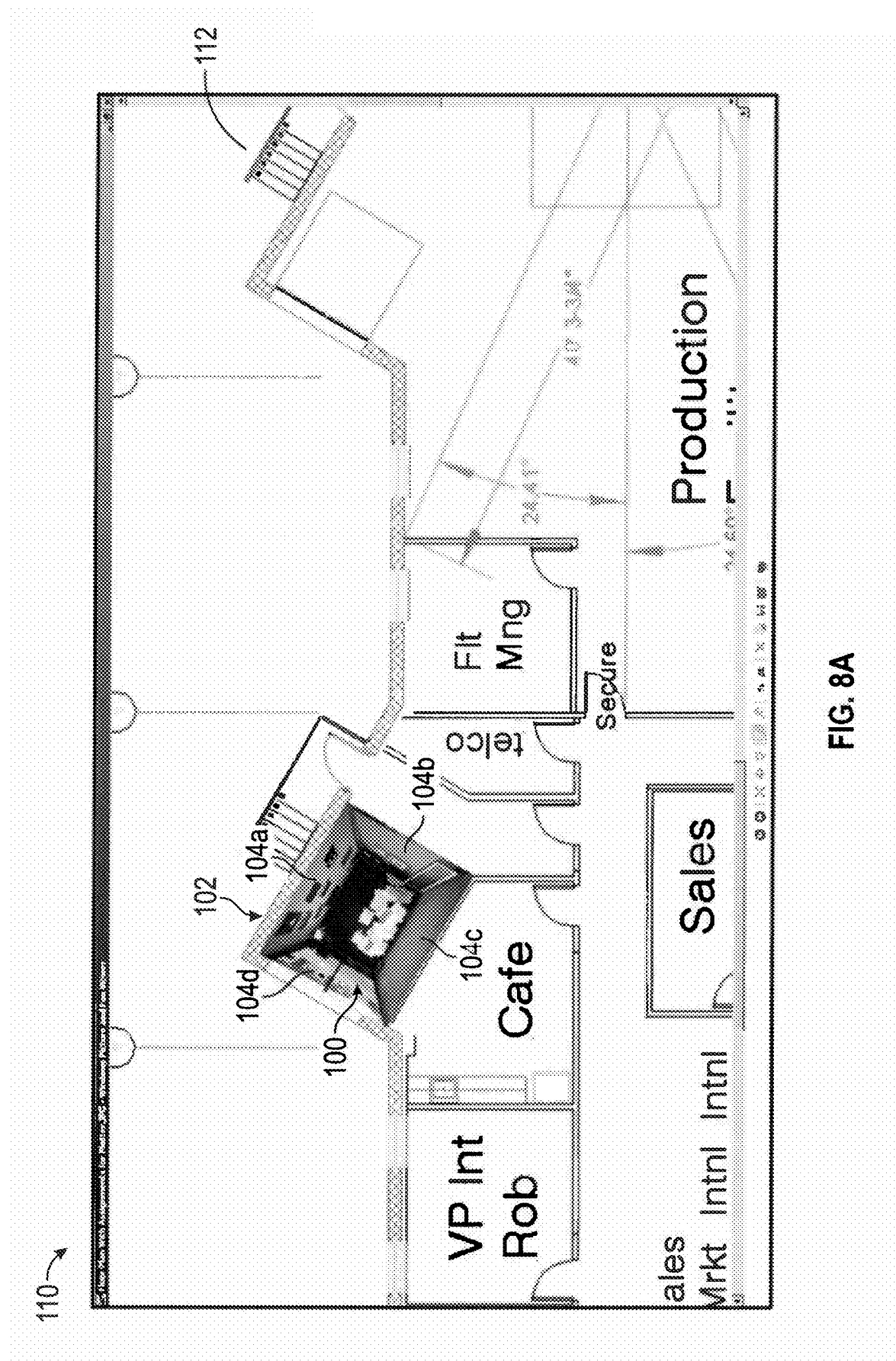
FIG. 8A illustrates an exemplary screen shot of a webpage showing a floor plan with one room having the multi-3D perspective floor plan shown in FIG. 7.

For example, in some embodiments, the multi-3D perspective fitted image 100, as shown in FIG. 7, may be provided as a layer that is overlaid on a typical floor plan. For example, FIG. 8A illustrates an exemplary screen shot 110 of a webpage having a floor plan 112. The floor plan 112 includes multiple rooms and hall ways, including the room 102 rendered in FIG. 7. The multi-3D perspective floor plan 100 of the room 102 may be added into the floor plan 112, as is shown in FIG. 8A, such that a user has an option to select and/or view either the typical floor plan view or the multi-3D perspective floor plan representation for each room.

Figure 8B:
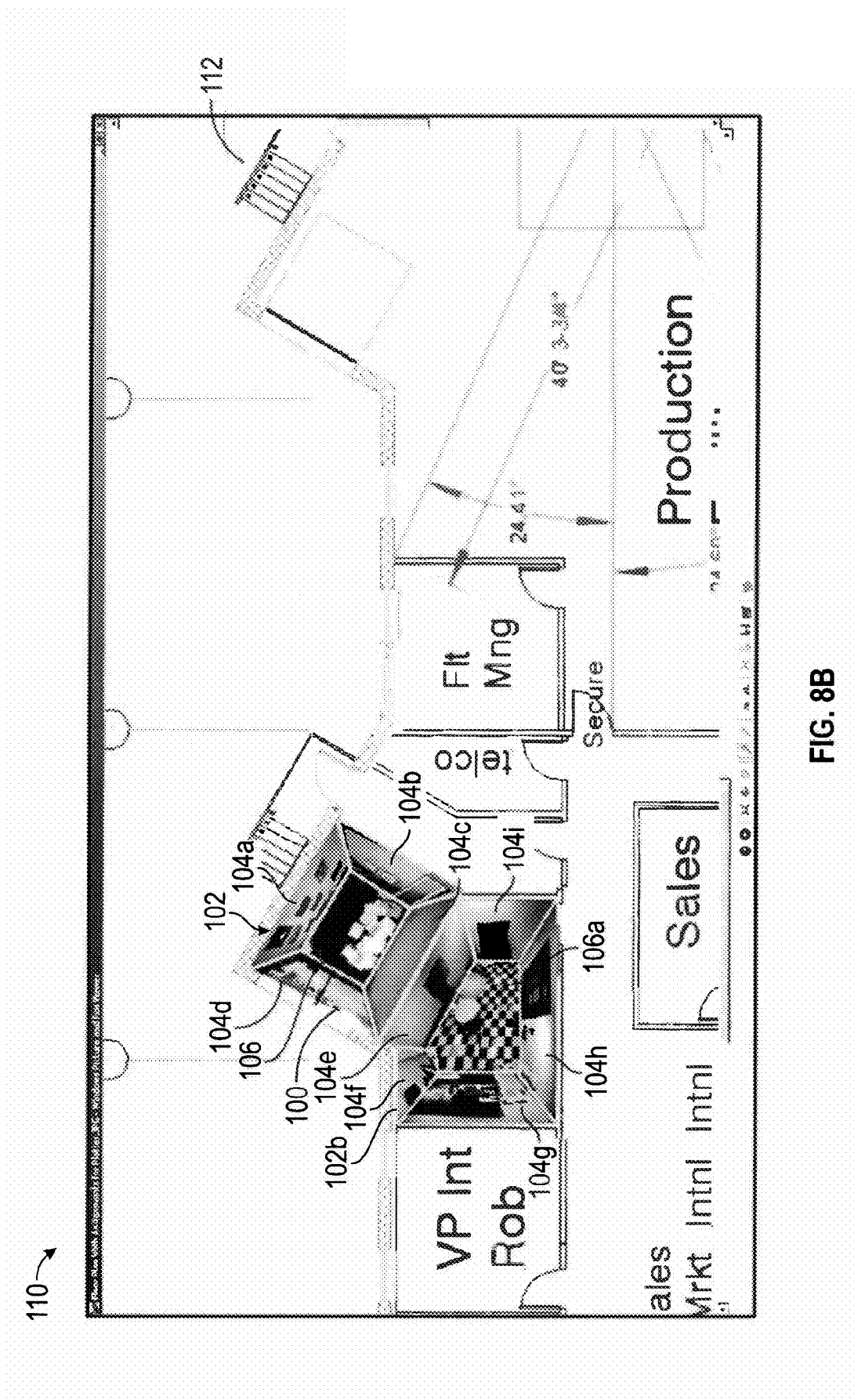
FIG. 8B illustrates an exemplary screen shot of a webpage showing the multi-3D perspective floor plan illustrated in FIG. 8A with two rooms.

FIG. 8B illustrates an exemplary screen shot 110 of a webpage having the floor plan 112 with the room 102 and an additional room 102b. The room 102 includes a 3D fitted representation of real-life physical characteristics of the walls 104a-d and the floor 106 from an overhead perspective having a nadir viewing direction extending from a first location. The room 102b includes a 3D fitted representation of real-life physical characteristics of the walls 104e-h and the floor 106a from an overhead perspective having a nadir viewing direction extending from a second location. Although the floor plan 112 is provided with two rooms (i.e., the room 102 and the room 102b) displayed with the 3D fitted representation, it should be understood that more rooms or even all of the rooms in the floor plan 112 can be shown with the 3D fitted representation.

In some embodiments, the floor plan 112 and the floor plan 100 with imagery showing real-life physical characteristics may each be individual layers such that each one may be visually provided by user selection. For example, Geographical Information System (GIS) software is often used for building information modeling. Both the floor plan 112 and the floor plan 100 with imagery may be used as layers within the GIS software such that the user may select the floor plan 112 with imagery to provide additional detailed information as needed. Further, as GIS software is geospatially indexed, the software may further include instructions such that when a user selects a room within the floor plan 112 or the floor plan 100, a menu may be provided adding options for viewing such room via the floor plan 112, the floor plan 100, or a three-dimensional model of the room. For example, a first responder using one or more processors 40 may select the room 102 within the floor plan 112. A menu may be provided to the first responder to select whether to view the room 102 using the floor plan 100, giving the first responder a visual representation of real-life physical characteristics of the room 102. Even further, in some embodiments, the menu may provide an option to enter a three-dimensional model rendering program to view the room 102. For example, some GIS systems are fully three-dimensionally aware such that the three-dimensional model of the room 102 may be a third layer capable of being selected by a user. By accessing the program logic 38 of the computer system 14 illustrated in FIG. 1, the first responder may be able to access the floor plan 112, the floor plan 100, and/or a three-dimensional model of the room 102 without having to locate additional software and/or third party programs on the scene.

Alternatively, the floor plan 100 having imagery overlaid therein may be provided within a physical report. For example, the floor plan 100 having imagery overlaid therein may be provided in a hard copy. Hard copies may allow for external markings (e.g., markers, grease pencils) during an emergency situation. Additionally, hard copies may reduce reliance on technology mishaps during the emergency situation (e.g., battery life, screen viewing in sunlight, and/or the like).

In some embodiments, the hard copy of the floor plan 100 having imagery overlaid therein may be provided within a lock box at the physical location of the structure. The lock box may house the hard copy such that first responders may be able to access the floor plan 100 on scene during an emergency event.

In some embodiments, the floor plan 100 having imagery overlaid therein may be created automatically using a textured three-dimensional model floor plan, such as the floor plan 20 depicted in FIG. 2.

Figure 9:
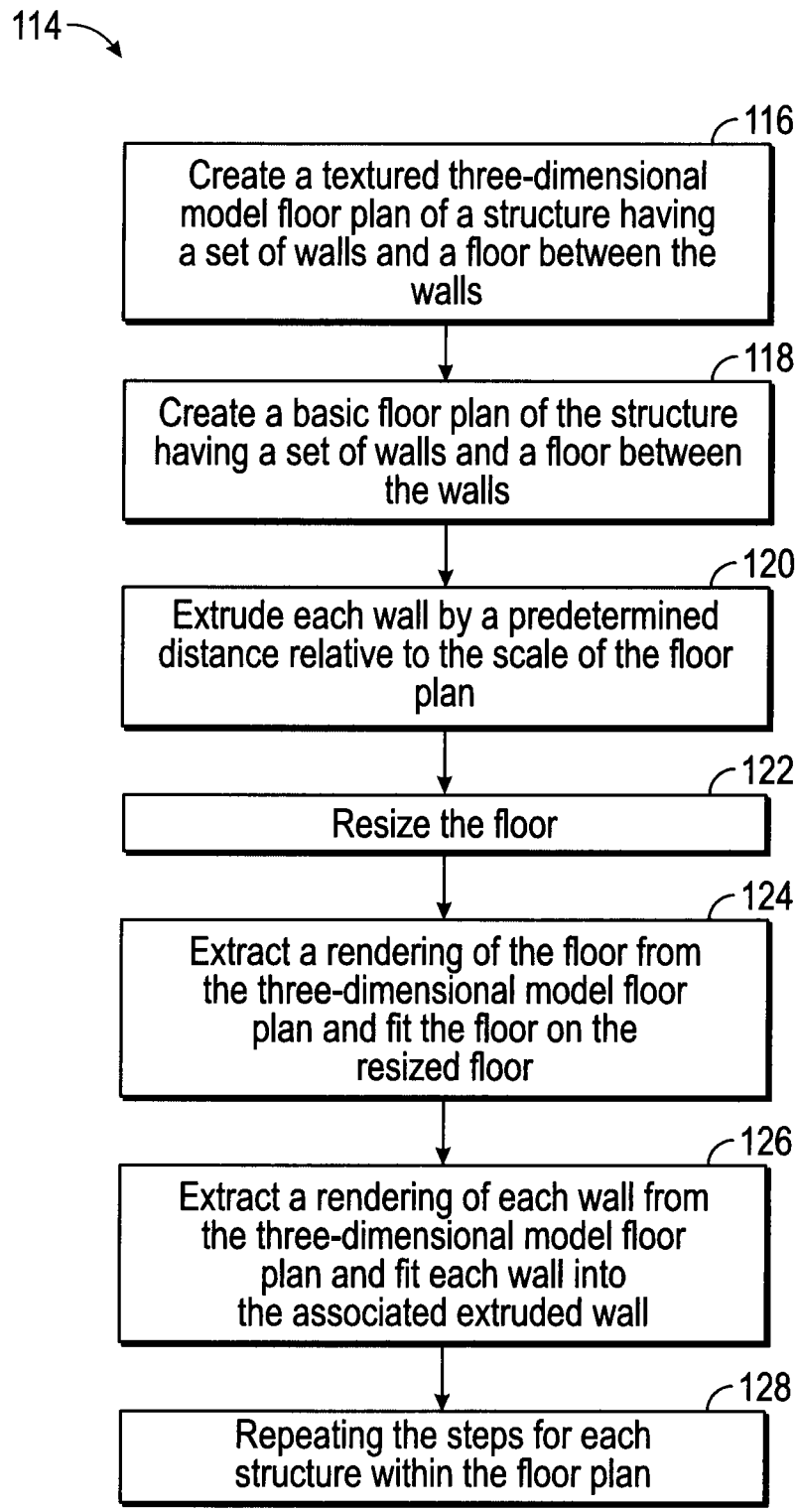
FIG. 9 is a flow chart of another exemplary method for generating a multi-3D perspective floor plan representation using a textured three-dimensional model in accordance with the present disclosure.

FIG. 9 illustrates a flow chart 114 of an exemplary method for generating a multi-3D perspective representation of real-life physical characteristics of the set of walls 54 and floor 56 of the interior room 52 from an overhead perspective using images and/or data acquired from the image capturing system 12 and using a textured three-dimensional model floor plan 20.

In a step 116, a textured three-dimensional model floor plan, similar to the floor plan 20 illustrated in FIG. 2, may be created and/or obtained. The three-dimensional model floor plan may include one or more rooms 130 comprising a set of walls 132a-d and a floor 134 between the walls. In some embodiments, a RGB sensor may be provided during creation of the floor plan 20. The RBG sensor may provide color representations of elements within the data points obtained. In some embodiments, the computer system 14 may generate the floor plan 20 using data obtained from the image capturing system 12 (e.g., LiDAR scanner and/or RGB sensor). Alternatively, the computer system 14 may obtain the floor plan 20 from a third party system via the network 42.

In a step 118, a basic floor plan, similar to the floor plan 50a of FIG. 4A may be created and/or obtained. The floor plan 50a may include an overhead view of the one or more rooms 130. Each room 130 may include one or more walls 54 and the floor 56 between the walls 54. In some embodiments, the floor plan 50a may include multiple rooms 130. In embodiments having multiple rooms 130, the rooms 130 may be contiguous, adjoining, and/or separate rooms.

In a step 120, each wall 54 of the floor plan 50a may be extruded by a pre-defined distance d. The distance d may be determined relative to the scale of the floor plan 50a. The distance may also be determined such that elements on and/or positioned adjacent to each wall 54 may be visually represented without obscuring the floor 56. Although in FIG. 4B, the distance d is used for each wall 54a-d, it should be noted, that each wall may be extracted such that distance d may vary from one wall versus another wall. Alternatively, each wall may be extracted such that the distance d may be substantially similar. In a step 122, the floor 56 may be resized to accommodate the extracted walls 54 generating the multi-3D perspective floor plan 50b illustrated in FIG. 4B.

In a step 124, a rendering of the floor 134 from the textured three-dimensional floor plan 20 may be extracted. The floor 134 may be fit to the resized floor 56 within the multi-3D perspective floor plan 50b. For example, the extracted rendering of the floor 134 from the textured three-dimensional floor plan 20 may be scaled, rotated, and/or otherwise fit to the sizing of the floor 56 within the multi-3D perspective floor plan 50b.

In a step 126, each wall 132a-d from the textured three-dimensional floor plan 20 may be extracted. After extraction, each wall 132a-d may be fit within the space provided between resized floor 56 and the outline 62 of the interior room 52 within the respective positions within the floor plan 50a. For example, each wall 132a-d may be scaled, rotated, and/or otherwise fit to the spacing between the resized floor 56 and the outline 62 of the interior room 52. In some embodiments, fitting each extract wall 132a-d to the spacing between the resized floor 56 and the outline 62 of the interior room 52 may further include skewing the extracted wall 132 similar to the wall illustrated in FIG. 6.

In a step 128, the steps of the method may be repeated for each structure within the floor plan 50a such that a multi-3D perspective floor plan of the structure includes a fitted representation of real-life physical characteristics of walls 132a-d and floor 134 of the room 130.

Although the preceding description has been described herein with reference to particular means, materials and embodiments, it is not intended to be limited to the particulars disclosed herein; rather, it extends to all functionally equivalent structures, methods and uses, such as are within the scope of the appended claims. For example, many of the examples relate to first responders, however, the multi-3D perspective floor plan may be used in other applications as well. Building management software may include the multi-3D perspective floor plan such that building managers are able to use the visual representations provided by the multi-3D perspective floor plan for their planning and/or management. Additionally, the multi-3D perspective floor plan may be used and/or distributed as evacuation plans, such that people within a structure may be able to easily locate emergency exits, and/or the like. In another example, the multi-3D perspective floor plan may be used to identify and visualize proposed changes to a structure. For example, multi-3D perspective floor plans may be created of a proposed space and/or structure, and the space and/or structure may be analyzed in relation to a current structure.

What is claimed is:

1. A computer system, comprising:
   one or more processors; and,
   one or more non-transitory computer readable medium accessible by the one or more processors and storing instructions that when executed by the one or more processors cause the one or more processors to:
   access data indicative of a floor plan of a structure, the floor plan having a first room comprising a first set of walls and a first floor between the walls in the first set of walls, a second room comprising a second set of walls and a second floor between the walls in the second set of walls; and
   access a set of image data depicting the first set of walls and the first floor of the first room and the second set of walls and the second floor of the second room;
   wherein the instructions, when executed by the processor, further cause the processor to generate one or more output signals indicative of a multi-3D perspective floor plan created from the floor plan and portions of the set of image data, the multi-3D perspective floor plan having:
   a first 3D fitted representation of real-life physical characteristics of the first set of walls and the first floor of the first room, the first 3D fitted representation generated by extracting each wall of the first set of walls a distance inward from an outline of the first room and resizing the first floor to accommodate the extracted walls such that real life physical characteristics within and on each wall of the first set of walls is visually represented without obscuring the first floor when viewed from a first perspective having a first viewing direction extending from a first viewing location; and,
   a second 3D fitted representation of real-life physical characteristics of the second set of walls and the second floor of the second room, the second 3D fitted representation generated by extracting each wall of the second set of walls a distance inward from an outline of the second room and resizing the second floor to accommodate the extracted walls such that real life physical characteristics within and on each wall of the second set of walls is visually represented without obscuring the second floor when viewed from a second perspective having a second viewing direction extending from a second viewing location,
   wherein at least one of the first viewing direction differs from the second viewing direction, and the first viewing location differs from the second viewing location.

2. The computer system of claim 1, wherein the image data includes CAD drawings.

3. The computer system of claim 2, wherein the first perspective is an overhead perspective.

4. The computer system of claim 3, wherein the first viewing direction is a nadir direction.

5. The computer system of claim 4, wherein the second perspective is an overhead perspective.

6. The computer system of claim 5, wherein the second viewing direction is a nadir direction.

7. The computer system of claim 1, wherein the computer system comprises at least one processor in communication with an image capturing system.

8. The computer system of claim 7, wherein the image capturing system comprises a LiDAR scanner, and the image data includes data points obtained by the LiDAR scanner forming a three-dimensional model floor plan of the walls and the floor.

9. The computer system of claim 8, wherein the instructions, when executed by the processor, relate the three-dimensional model floor plan of the room and render the multi-3D perspective floor plan.

10. The computer system of claim 7, wherein the image data includes at least one image captured by the image capturing system.

11. The computer system of claim 1, wherein the instructions, when executed by the processor, further fill the floor plan with a first color and relating the image data to the room includes positioning images of the floor and images of the wall such that the first color is visible within the multi-3D perspective floor plan.

12. The computer system of claim 1, wherein the instructions, when executed by the processor, generate the first 3D fitted representation of real-life physical characteristics of the first set of walls of the first room from operator input and a plurality of image data which collectively shows the real-life physical characteristics of the first set of walls of the first room.

13. The computer system of claim 1, wherein the instructions, when executed by the processor, generate the first 3D fitted representation of real-life physical characteristics of the first set of walls of the first room in an automated process using a plurality of image data which collectively shows the real-life physical characteristics of the first set of walls of the first room.

14. An automated method of generating a multi-3D perspective floor plan of a structure performed by a processor of a computer system, comprising:
   generating a first 3D fitted representation of real-life physical characteristics of a first set of walls and the first floor of a first room, the first 3D fitted representation generated by extracting each wall of the first set of walls a distance inward from an outline of the first room and resizing a first floor to accommodate the extracted walls such that real life physical characteristics within and on each wall of the first set of walls is visually represented without obscuring the first floor when viewed from a first perspective having a first viewing direction extending from a first viewing location; and generating a second 3D fitted representation of real-life physical characteristics of a second set of walls and a second floor of a second room, the second 3D fitted representation generated by extracting each wall of the second set of walls a distance inward from an outline of the second room and resizing the second floor to accommodate the extracted walls such that real life physical characteristics within and on each wall of the second set of walls is visually represented without obscuring the second floor when viewed from a second perspective having a second viewing direction extending from a second viewing location;

wherein at least one of the first viewing direction differs from the second viewing direction, and the first viewing location differs from the second viewing location.

15. The method of claim 14, wherein the first perspective is an overhead perspective.

16. The method of claim 15, wherein the second perspective is an overhead perspective.

17. The method of claim 16, wherein the first viewing direction is nadir direction.

18. A computerized system, comprising:

a computer system storing a database of multi-3D perspective floor plans of structures with corresponding geo-location data identifying the structures within the database, the structures having one or more room(s) comprising a set of walls and a floor between the walls and the multi-3D perspective floor plans are generated by extracting each wall of the set of walls a distance inward from an outline of a room and resizing the floor to accommodate the extracted walls such that real life physical characteristics within and on each wall of the set of walls is visually represented without obscuring the floor when viewed from a perspective having a viewing direction extending from a viewing location, the computer system further having computer executable logic that when executed by a processor causes the computer system to receive a geographic point from a user, search the database to find at least one multi-3D perspective floor plan that corresponds to the geographic point, and make the multi-3D perspective floor plan that contains the geographic point available to the user.

19. A method of providing a multi-3D perspective floor plan to a user, comprising the steps of:

storing a database of multi-3D perspective floor plans of structures with corresponding geo-location data identifying the structures within the database, the multi-3D perspective floor plans having one or more room(s) comprising a set of walls and a floor between the walls in the set, and a set of image data depicting the walls and the floor of the room(s), the multi-3D perspective floor plans generated by extracting each wall of the set of walls a distance inward from an outline of each room of the one or more room(s) and resizing the floor to accommodate the extracted walls such that real life physical characteristics within and on each wall of the set of walls is visually represented without obscuring the floor when viewed from a perspective having a viewing direction extending from a viewing location;

receiving, via one or more I/O port, a geographic point from the user;

searching the database to find at least one multi-3D perspective floor plan that contains the geographic point and the set of image data depicting the walls and the floor images that contain the geographic point; and making the floor plans and the set of image data depicting the walls and the floor of the multi-3D perspective floor plan that contains the geographic point available to the user.

* * * * *